US012019375B2

(12) United States Patent
Zi et al.

(10) Patent No.: US 12,019,375 B2
(45) Date of Patent: Jun. 25, 2024

(54) PHOTOSENSITIVE MATERIAL AND METHOD OF LITHOGRAPHY

(71) Applicant: Taiwan Semiconductor Manufacturing Co., Ltd., Hsin-Chu (TW)

(72) Inventors: An-Ren Zi, Hsinchu (TW); Ching-Yu Chang, Yilang County (TW); Chien-Wei Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 695 days.

(21) Appl. No.: 16/707,448

(22) Filed: Dec. 9, 2019

(65) Prior Publication Data
US 2020/0110338 A1 Apr. 9, 2020

Related U.S. Application Data

(62) Division of application No. 15/150,171, filed on May 9, 2016, now Pat. No. 10,503,070.
(Continued)

(51) Int. Cl.
*G03F 7/20* (2006.01)
*G03F 7/004* (2006.01)
(Continued)

(52) U.S. Cl.
CPC .............. *G03F 7/20* (2013.01); *G03F 7/0042* (2013.01); *G03F 7/091* (2013.01); *G03F 7/11* (2013.01);
(Continued)

(58) Field of Classification Search
CPC .......... G03F 7/20; G03F 7/0042; G03F 7/091; G03F 7/11; G03F 7/16; G03F 7/168; G03F 7/32; H01L 21/0271
See application file for complete search history.

(56) References Cited

U.S. PATENT DOCUMENTS 4,156,745 A * 5/1979 Hatzakis ................. G03F 7/039
522/182
8,048,764 B2 11/2011 Huang et al.
(Continued)

FOREIGN PATENT DOCUMENTS

| CN | 101464628 A | 6/2009 |
| JP | 2008089952 A | 4/2008 |
| JP | 2008151929 A | 7/2008 |

OTHER PUBLICATIONS

U.S. Appl. No. 14/851,093, entitled "Novel Photoresist Having Sensitizer Bonded to Acid Generator," filed Sep. 11, 2015, 43 pgs.

*Primary Examiner* — Peter L Vajda
*Assistant Examiner* — Jayson D Cosgrove
(74) *Attorney, Agent, or Firm* — Haynes and Boone, LLP

(57) ABSTRACT

Materials directed to a photosensitive material and a method of performing a lithography process using the photosensitive material are described. A semiconductor substrate is provided. A first layer including a floating additive is formed over the semiconductor substrate. A second layer including an additive component having a metal cation is formed over the first layer. One or more bonds are formed to bond the metal cation and one or more anions. Each of the one or more anions is one of a protecting group and a polymer chain bonding component. The polymer chain bonding component is bonded to a polymer chain of the layer. The second layer is exposed to a radiation beam.

20 Claims, 22 Drawing Sheets

Related U.S. Application Data

(60) Provisional application No. 62/265,869, filed on Dec. 10, 2015.

(51) Int. Cl.
*G03F 7/09* (2006.01)
*G03F 7/11* (2006.01)
*G03F 7/16* (2006.01)
*G03F 7/32* (2006.01)
*H01L 21/027* (2006.01)

(52) U.S. Cl.
CPC .............. *G03F 7/16* (2013.01); *G03F 7/168* (2013.01); *G03F 7/32* (2013.01); *H01L 21/0271* (2013.01)

(56) References Cited

U.S. PATENT DOCUMENTS

| | | |
|---|---|---|
| 8,178,287 B2 | 5/2012 | Chang et al. |
| 8,216,767 B2 | 7/2012 | Wang et al. |
| 8,257,910 B1 | 9/2012 | Guerrero |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 8,883,405 B2 | 11/2014 | Shiobara et al. |
| 8,968,989 B2 | 3/2015 | Ouattara et al. |
| 9,029,062 B2 | 5/2015 | Wang et al. |
| 9,146,469 B2 | 9/2015 | Liu et al. |
| 9,261,786 B2 | 2/2016 | Chang et al. |
| 9,983,474 B2 | 5/2018 | Chen et al. |
| 2011/0051058 A1* | 3/2011 | Oota .................. G03F 7/40 430/281.1 |
| 2012/0034558 A1* | 2/2012 | Chang .................. G03F 7/0046 430/322 |
| 2013/0069246 A1* | 3/2013 | Bae .................. H01L 21/0273 257/774 |
| 2013/0164691 A1* | 6/2013 | Shiobara .............. G03F 7/0046 430/325 |
| 2013/0177854 A1* | 7/2013 | Utsumi ................ G03F 7/0392 560/115 |
| 2013/0209936 A1 | 8/2013 | Hatakeyama |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0241783 A1* | 8/2015 | Carcasi ................ G03F 7/30 430/324 |
| 2015/0316846 A1 | 11/2015 | Zi |
| 2016/0238934 A1 | 8/2016 | Lai et al. |
| 2016/0274457 A1* | 9/2016 | Hiromatsu .............. G03F 7/11 |
| 2017/0256396 A1 | 9/2017 | Cheng et al. |

* cited by examiner

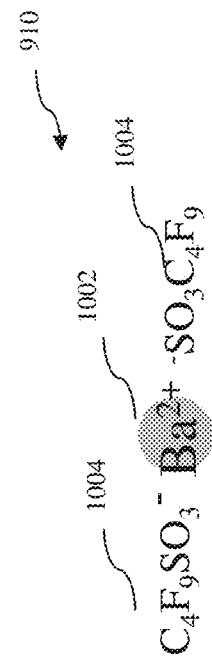
FIG. 10A
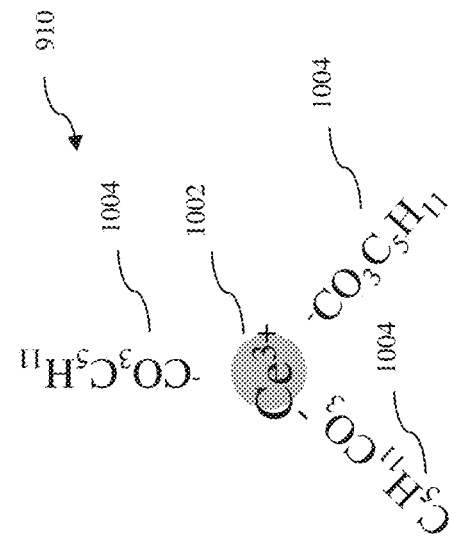
FIG. 10B
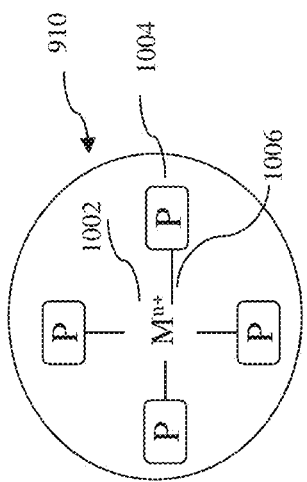
FIG. 10D
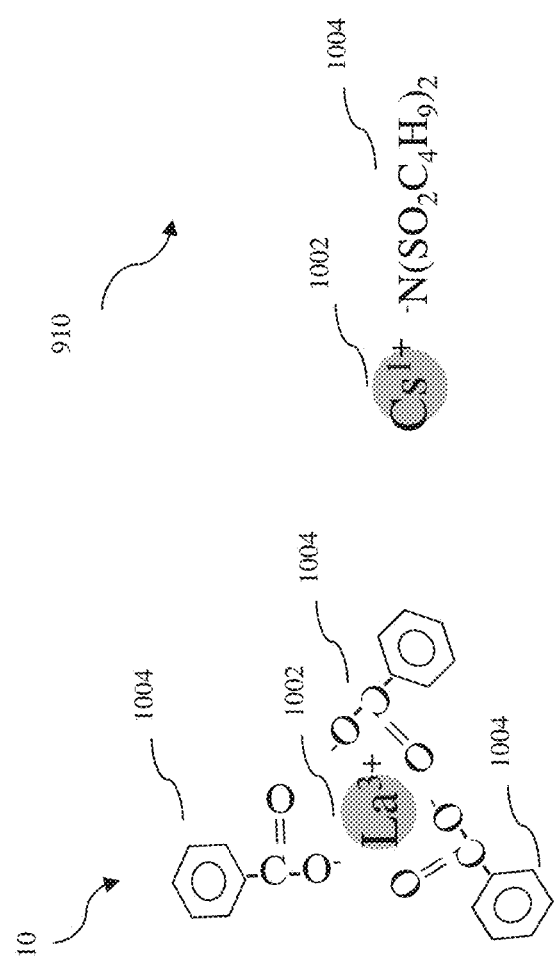
FIG. 10C
FIG. 10E

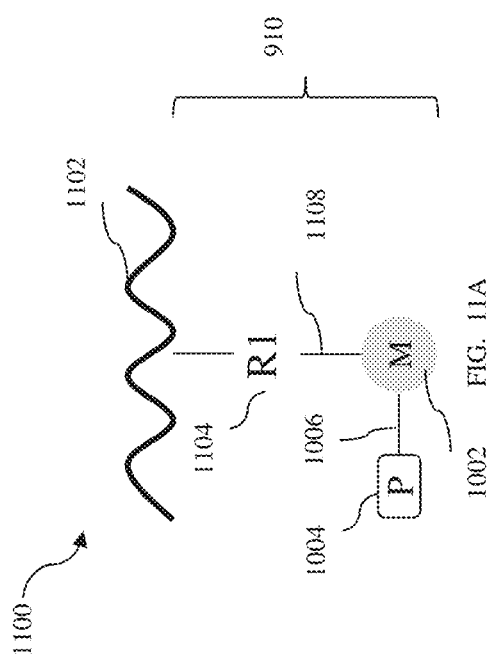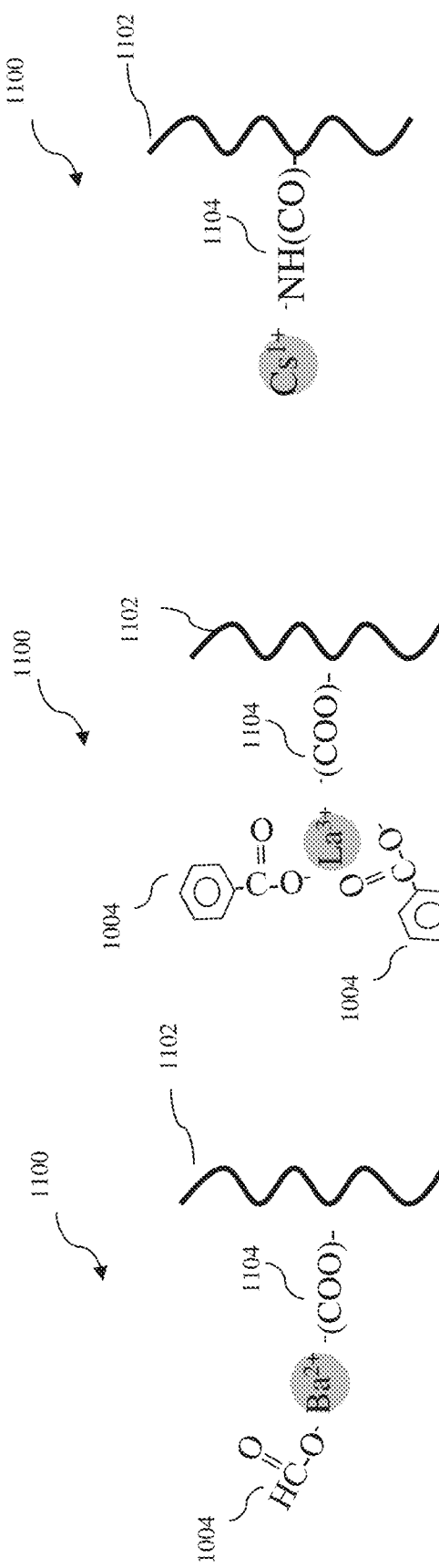
FIG. 11A
FIG. 11B
FIG. 11C
FIG. 11D

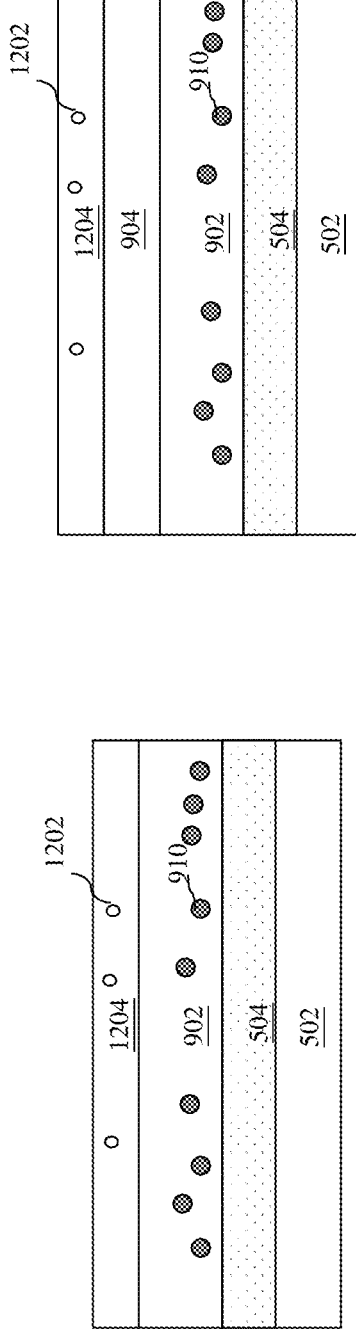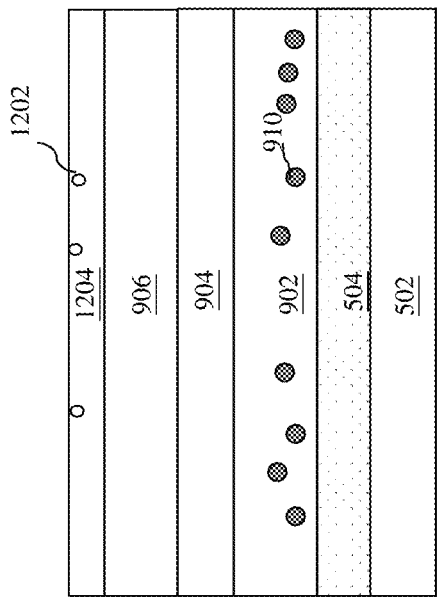
FIG. 12A
FIG. 12B
FIG. 12C

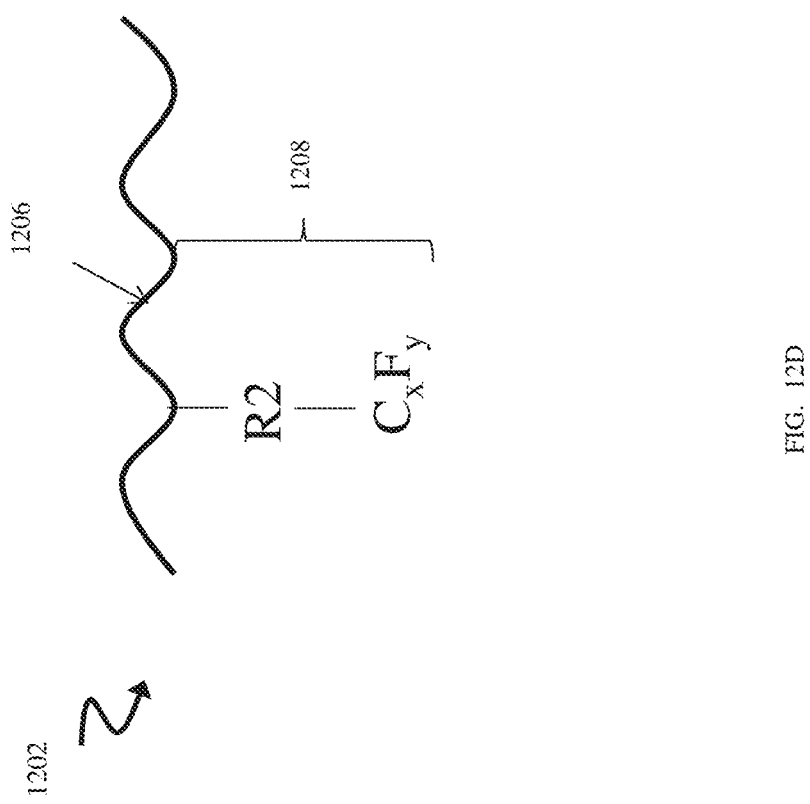

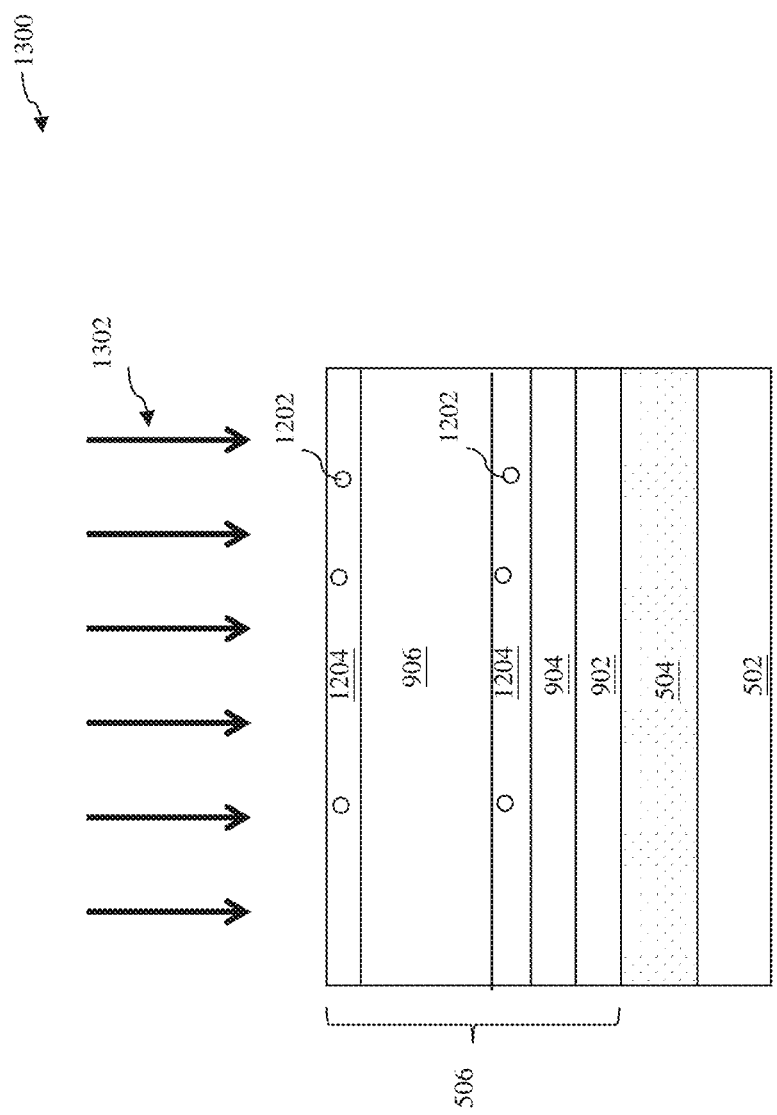

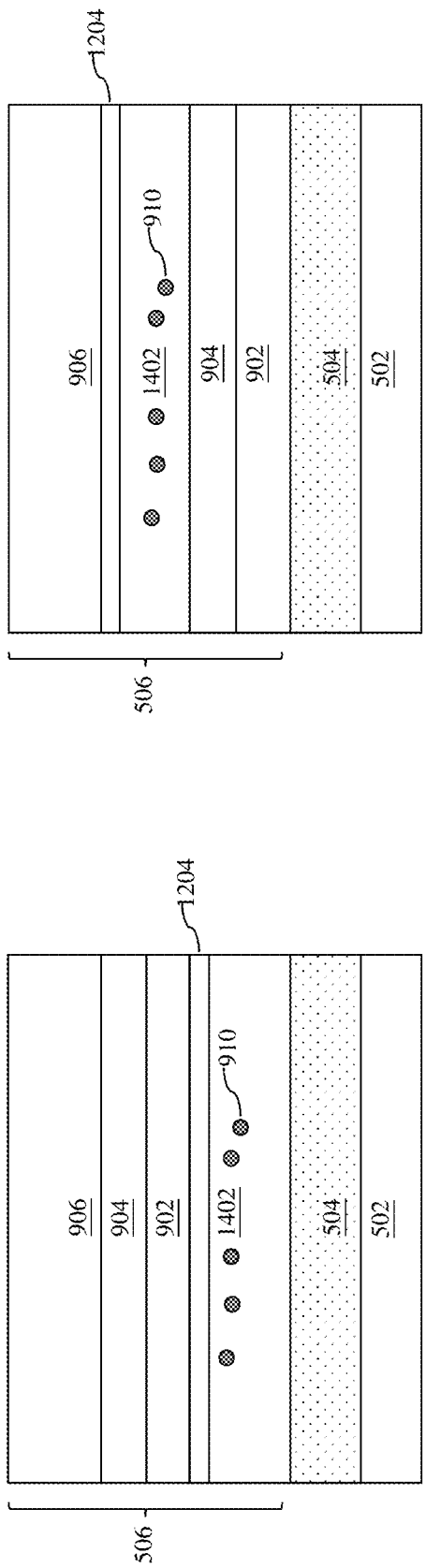
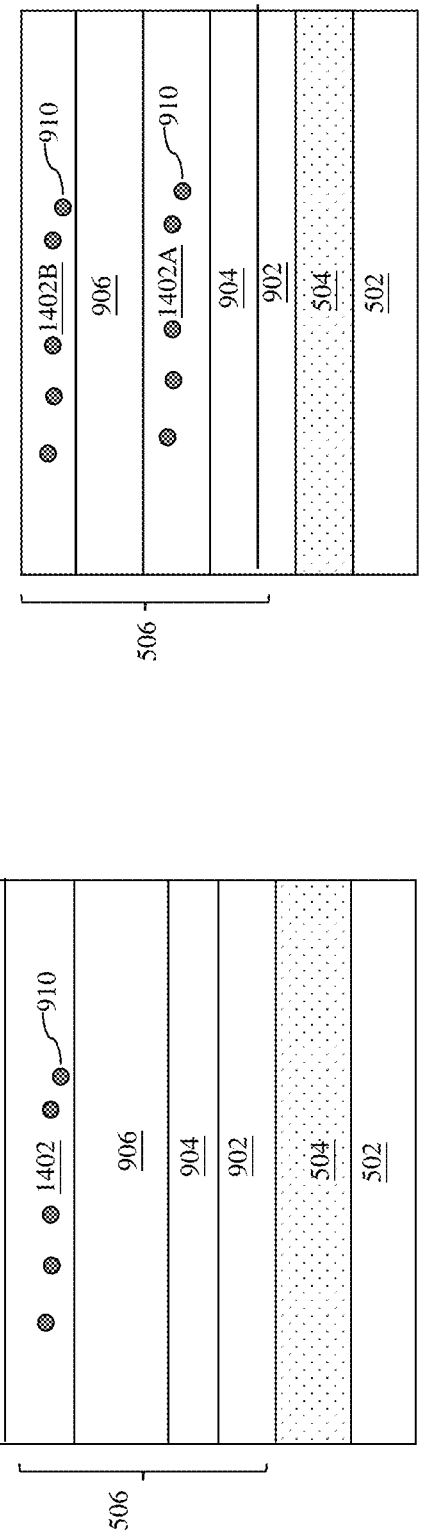
FIG. 15A FIG. 15B FIG. 15C FIG. 15D

PHOTOSENSITIVE MATERIAL AND METHOD OF LITHOGRAPHY

CROSS-REFERENCE TO RELATED APPLICATIONS

This patent claims the benefit of U.S. Provisional Application No. 62/265,869, filed Dec. 10, 2015, and is a divisional of U.S. application Ser. No. 15/150,171 filed May 9, 2016, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, EUV lithography still has some shortcomings related to photoresist, for example shortcomings with respect to sensitivity and/or efficiency. As a result, lithography performance may be compromised or degraded.

Thus, a process and material that reduces, minimizes, or removes problems with a patterning material is desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 10A, 10B, 10C, 10D, 10E, 10F, 10G, 10H, 10I, 10J, 10K, 11A, 11B, 11C, and 11D illustrate embodiments of an additive component according to various aspects of the present disclosure.

FIGS. 12A, 12B, and 12C are diagrammatic fragmentary cross-sectional side views of an embodiment of a semiconductor device according to various aspects of the present disclosure. FIG. 12D illustrates an embodiment of a floating additive material according to various aspects of the present disclosure.

FIGS. 13, 14, 15A, 15B, 15C, 15D, and 16 are diagrammatic fragmentary cross-sectional side views of an embodiment of a semiconductor device according to various aspects of the present disclosure.

DETAILED DESCRIPTION

Figure 1:
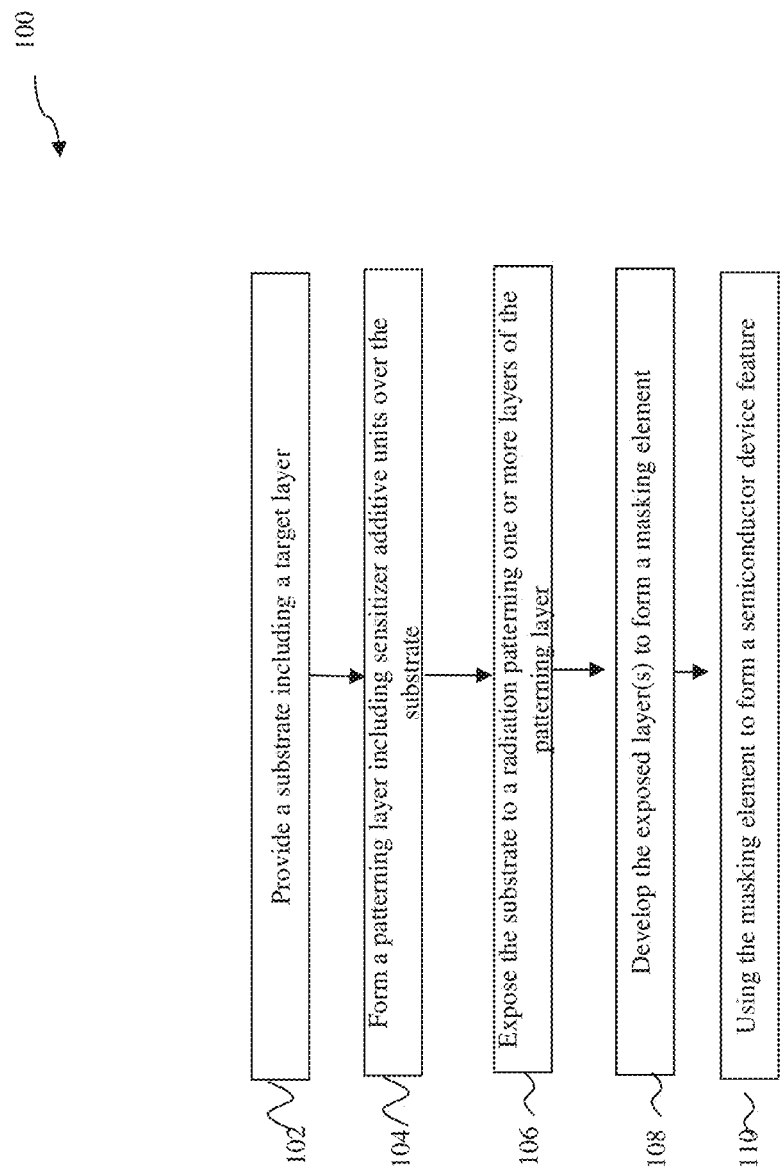
FIG. 1 is a flowchart of an embodiment of a method for making a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes, for example for 20 nanometer (nm) technology nodes or smaller. The EUV photolithography process using a EUV light with a wavelength of about 13.5 nm. However, an acid generator in the photoresist may not absorb such a low-wavelength UV light. According to the acid generating mechanism of the EUV exposure, a sensitizer may be used in the EUV lithography process. A sensitizer includes an element that absorbs the EUV light and generates secondary electrons. When the EUV light strikes the photoresist, the sensitizer in the photoresist absorbs the EUV light and generates secondary electrons. These secondary electrons then react with the acid generator to generate acid. Thereafter, the acid reacts with the photoresist polymers changing the chemical properties of the photoresist polymers. However, this process may suffer from poor acid generation sensitivity and efficiency due to weak EUV light absorption of the main elements (e.g., carbon, oxygen, and hydrogen) of the polymer and the acid generator in the photoresist. The present disclosure enhances photoresist sensitivity and efficiency while balancing sensitivity, resolution, and line width roughness (LWR) by using a sensitizer additive material having an element having higher EUV light absorption than the main elements of the photoresist.

FIG. 1 is a flowchart of an embodiment of a method 100 of making a semiconductor device 500 according to aspects of the present disclosure. FIGS. 2, 3, 4A, 4B, 4C, and 4D are flowcharts of various embodiments of methods of forming a patterning layer including sensitizer additive components at block 104 of the method 100. It is understood that the method 100 includes steps having features of a complementary metal-oxide-semiconductor (CMOS) technology process flow and thus, are only described briefly herein. Additional steps may be performed before, after, and/or during the method 100.

It is also understood that parts of the semiconductor device 500 may be fabricated by complementary metal-oxide-semiconductor (CMOS) technology process flow, and thus some processes are only briefly described herein. Further, the semiconductor device 500 may include various other devices and features, such as additional transistors, bipolar junction transistors, resistors, capacitors, diodes, fuses, etc., but is simplified for a better understanding of the inventive concepts of the present disclosure.

The semiconductor device 500 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 500 may include a plurality of semiconductor devices (e.g., transistors), which may be interconnected.

The method 100 begins at block 102 providing a substrate including a target layer. Referring to the example of FIG. 5A, a substrate 502 is illustrated. The substrate may be a semiconductor substrate, such as a semiconductor wafer. The substrate may include silicon in a crystalline structure. In alternative embodiments, the substrate may include germanium, silicon germanium, silicon carbide, gallium arsenide, indium arsenide, indium phosphide, and/or other suitable materials. The substrate may be a silicon-on-insulator (SOI) substrate.

In some embodiments, the substrate 502 is substantially conductive or semi-conductive. The electrical resistance may be less than about $10^3$ ohm-meter. In some embodiments, the substrate 502 contains metal, metal alloy, metal nitride, and/or metal/sulfide/selenide/oxide/silicide with the formula $MX_a$, where M is a metal, and X is N, S, Se, O, Si, and where "a" is in a range from about 0.4 to about 2.5. For example, the substrate 502 may contain Ti, Al, Co, Ru, TiN, $WN_2$, and/or TaN.

In some other embodiments, the substrate 502 contains a dielectric material with a dielectric constant in a range from about 1 to about 40. In some other embodiments, the substrate 502 contains Si, metal oxide, or metal nitride, where the formula is $MX_b$, wherein M is a metal or Si, and X is N or O, and wherein "b" is in a range from about 0.4 to about 2.5. For example, the substrate 502 may contain $SiO_2$, silicon nitride, aluminum oxide, hafnium oxide, and/or lanthanum oxide.

In some embodiments, the substrate 502 may include a plurality of layers and/or features formed on the semiconductor substrate including doped regions or wells, isolation regions such as shallow trench isolation (STI) features, conductive layers, insulating layers, and various other suitable features. For example, the substrate may include one or more target layers, which are desired to patterned. In embodiments, the substrate 502 has any plurality of layers (conductive layer, insulator layer) or features (source/drain regions, gate structures, interconnect lines and vias), formed thereon. The substrate 502 may include one or more target layers 504 disposed on a semiconductor substrate; the target layers 504 suitable for patterning by the method 100, and may be referred to as patternable layers 504. Exemplary target layers include gate layers, interconnect layers, and/or other suitable layers. In some embodiments, the target layer 504 includes a dielectric material, such as silicon oxide or silicon nitride. In some embodiments, the target layer 504 includes metal. In some embodiments, the target layer 504 includes a semiconductor material. It is understood that the substrate 502 and the target layer 504 may each include additional suitable material compositions in other embodiments.

In some embodiments, the patterning by the method 100 may be suitable to etch portions of the semiconductor substrate 502 itself (e.g., such as in the formation of fins for a fin-type field effect transistor).

Referring now to FIG. 1, the method 100 then proceeds to block 104, where a patterning layer including a sensitizer additive component may be formed over the substrate. In various embodiments, when the patterning layer 506 is exposed to a EUV light (e.g., during a subsequent EUV photolithography process using a EUV light having a wavelength of about 13.5 nm), the sensitizer additive component in the patterning layer 506 may absorb the EUV light and release secondary electrons, which then react with the PAG to generate acid. As such, the sensitizer additive component may be used to improve sensitivity of the patterning layer 506. The sensitizer additive component is discussed in detail below with reference to FIGS. 2 and 10A-11D.

Figure 5B:
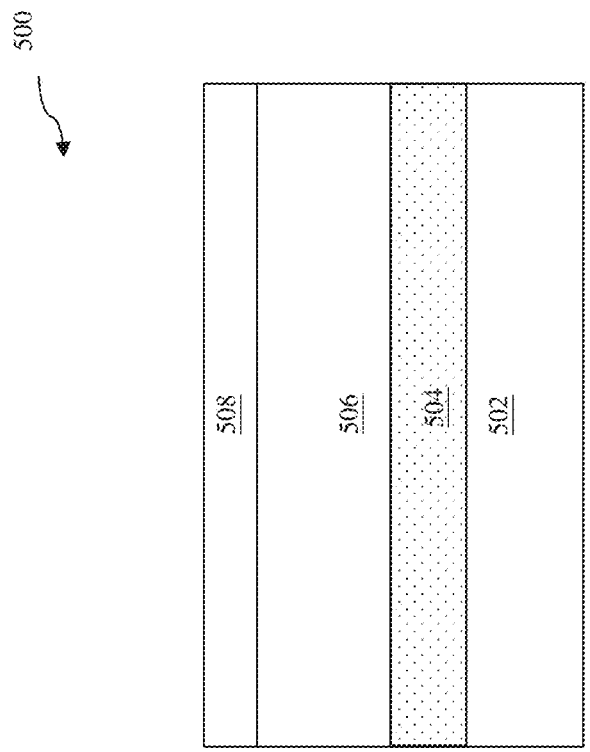
FIGS. 5A, 5B, 6, 7, 8, and 9 are diagrammatic fragmentary cross-sectional side views of an embodiment of a semiconductor device according to various aspects of the present disclosure.
Figure 5A:
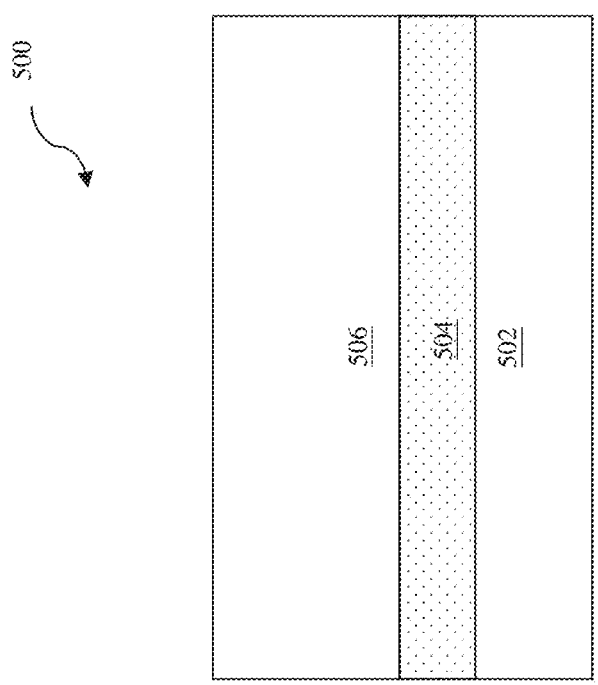

Referring to the example of FIG. 5A, a patterning layer 506 is disposed over the target layer 504. In some embodiments, the patterning layer 506 may include one or more layers having different optical properties. For example, the patterning layer 506 may include a tri-layer stack including a bottom inorganic layer (also referred to as an underlayer tri-layer stack), a middle anti-reflective coating layer (also referred to as a middle layer of the tri-layer stack), and a top photoresist layer (also referred to as a photoresist layer of the tri-layer stack). In some examples, the various layers of the patterning layer 506 may comprise substantially different refractive indexes (i.e., n values), extinction coefficients (i.e., k values), or thicknesses (T). In some embodiments, the various layers of the patterning layer 506 may further comprise different etching resistances and may contain at least one etching resistant molecule. The etching resistant molecule may include a low onishi number structure, double bond, triple bond, silicon, silicon nitride, Ti, TiN, Al, aluminum oxide, SiON, or combinations thereof.

In the illustrated example of FIG. 5A, the patterning layer 506 includes a positive photoresist, but it is understood that the patterning layer 506 may include a negative photoresist in alternative embodiments. The patterning layer 506 may contain components such as a polymer, photoacid generators (PAG), thermal acid generators (TAG), quenchers, chromophore, surfactant, cross linker, etc. In an embodiment, the PAG is bonded to the polymer. In some embodiments, in a subsequent photolithography process, photons induce decomposition of the PAG. As a result, a small amount of acid is formed, which further induces a cascade of chemical transformations in the patterning layer 506. The patterning layer 506 may also optionally include a quencher that is disposed within the patterning layer 506 in order to improve critical dimension (CD) control.

Referring now to FIG. 5B, in some embodiments, at block 104, a topcoat layer 508 may be formed over the patterning layer 506. In some embodiments, the sensitizer additive component in the patterning layer 506 may be volatile and diffuse out of the patterning layer 506. The topcoat layer 508 may act as a diffusion barrier layer so that the sensitizer additive component remains in the patterning layer 506. In some embodiments, the topcoat layer 508 may include a top antireflective coating (TARC), and/or other organic or inorganic coatings as known in the art. The topcoat layer 508 may be formed by a spin-on coating process, chemical vapor deposition process (CVD), physical vapor deposition (PVD) process, and/or other suitable deposition processes.

Referring now to FIG. 1, the method 100 then proceeds to block 106, where an exposure process is performed to expose the patterning layer thereby patterning the patterning layer. As discussed in detail below, the sensitizer additive components contained in the patterning layer 506 may promote more efficient photo-acid generation, thereby enhancing photoresist sensitivity and efficiency while balancing sensitivity, resolution, and line width roughness (LWR). The radiation beam may expose the resist deposited on the substrate using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

Figure 6:
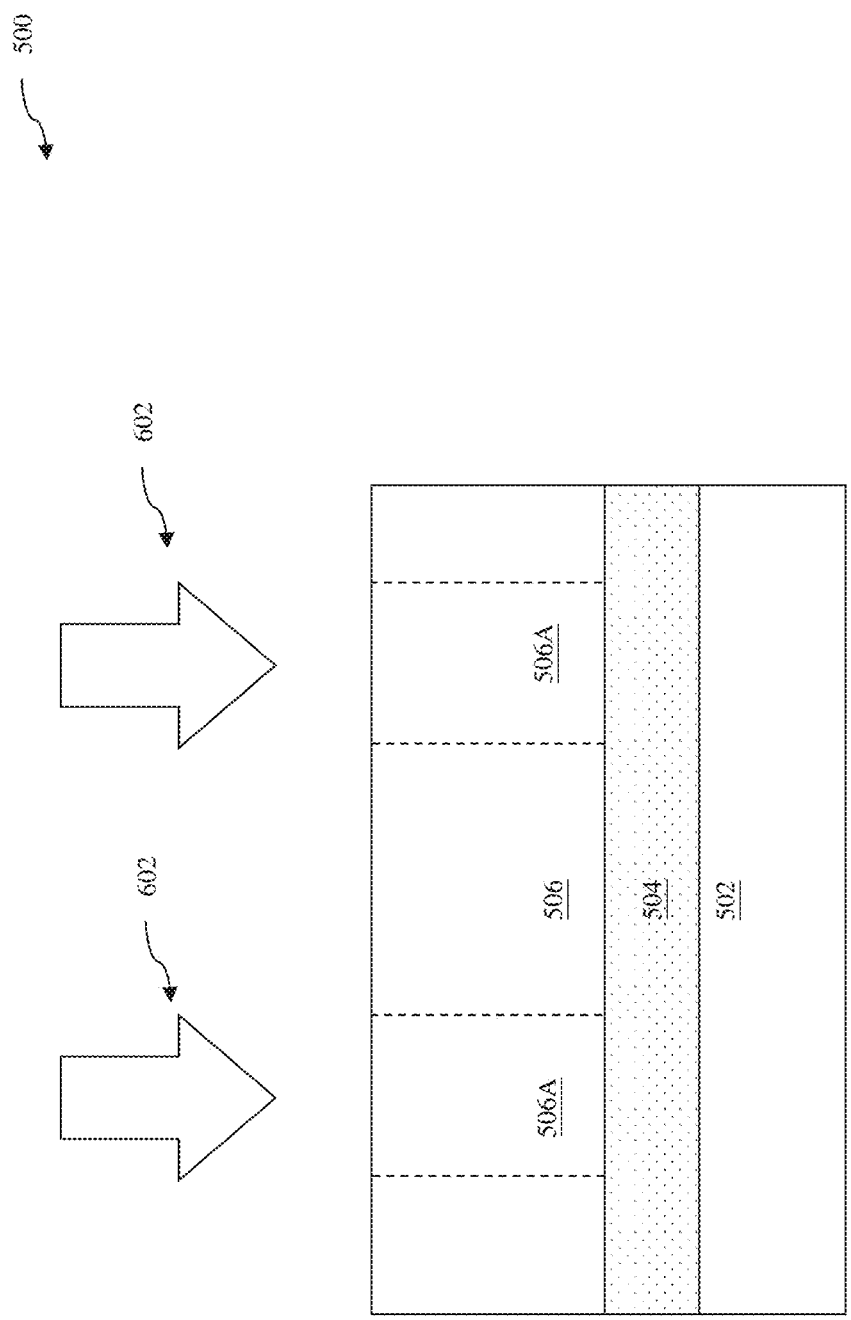

Referring now to the example of FIG. 6, a patterned radiation beam 602 is incident on the substrate 502 and specifically the patterning layer 506. The regions 506A illustrate the portions of the resist that have been exposed to the radiation, and thus, a chemical change has occurred in those regions. In the illustrated example of FIG. 6, the patterning layer 506 includes positive resist, and the regions 506A become soluble in developers. Alternatively, in the case of negative resist, the regions 506A are insoluble in developers.

In embodiments of the method 100, after the exposure process, a baking process may occur. The bake may be a hard bake. In an embodiment, the patterning layer 506 may include a chemically amplified resist (CAR), and the bake process serves to improve the insolubility of the CAR.

The method 100 then proceeds to block 108 where the exposed layer(s) are developed to form a masking element. A developer may be applied to the exposed resist to form a resist pattern on the substrate. In an embodiment, a positive tone developer is applied in block 108. The term "positive tone developer" refers to a developer that selectively dissolves and removes areas that received exposure dose (or an exposure dose above a predetermined threshold exposure dose value). In an embodiment, a negative tone developer is applied in block 108. The term "negative tone developer" refers to a developer that selectively dissolves and removes areas that received no exposure dose (or an exposure dose below a predetermined threshold exposure dose value).

In a embodiment, a developer may include an organic solvent or a mixture of organic solvents, such as methyl a-amyl ketone (MAK) or a mixture involving the MAK. In another embodiment, a developer includes a water based developer, such as tetramethylammonium hydroxide (TMAH). Applying a developer includes spraying a developer on the exposed patterning layer 506, for example by a spin-on process. In an embodiment, the developer may remove the exposed regions 506A of the patterning layer 506.

Figure 7:
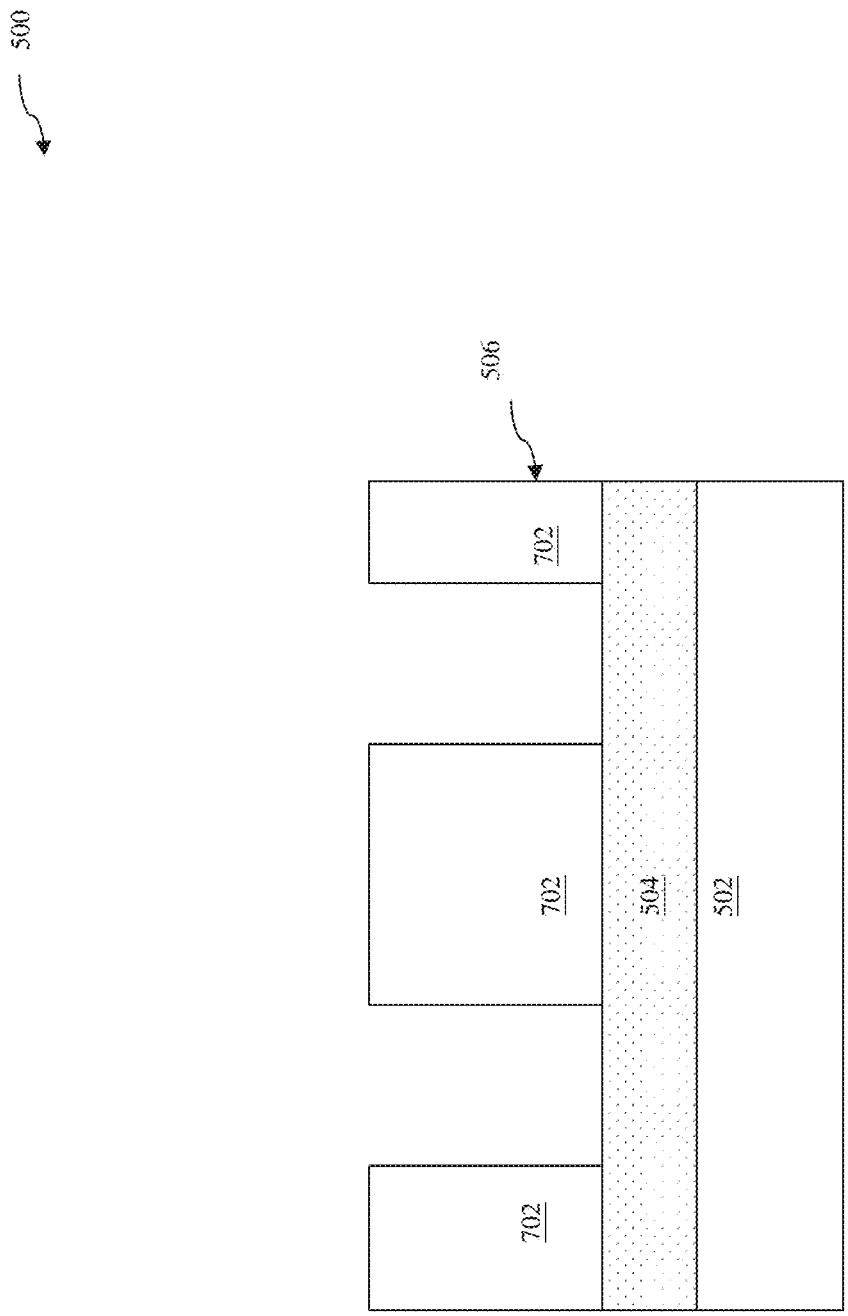

Referring to the example of FIG. 7, a masking element 702 is provided in the patterning layer 506. The masking element 702 may be formed by applying a developer to the exposed patterning layer 506. In an embodiment, the masking element 702 is used to etch an underlying layer. In turn, the etched underlying layer may be used as a masking element to pattern additional layers. In other embodiments or further embodiments, one or more of the layers on the substrate 502 may also be patterned using subsequent etching processes such as dry etching or plasma etching based on the pattern provided by the masking elements 702.

Figure 8:
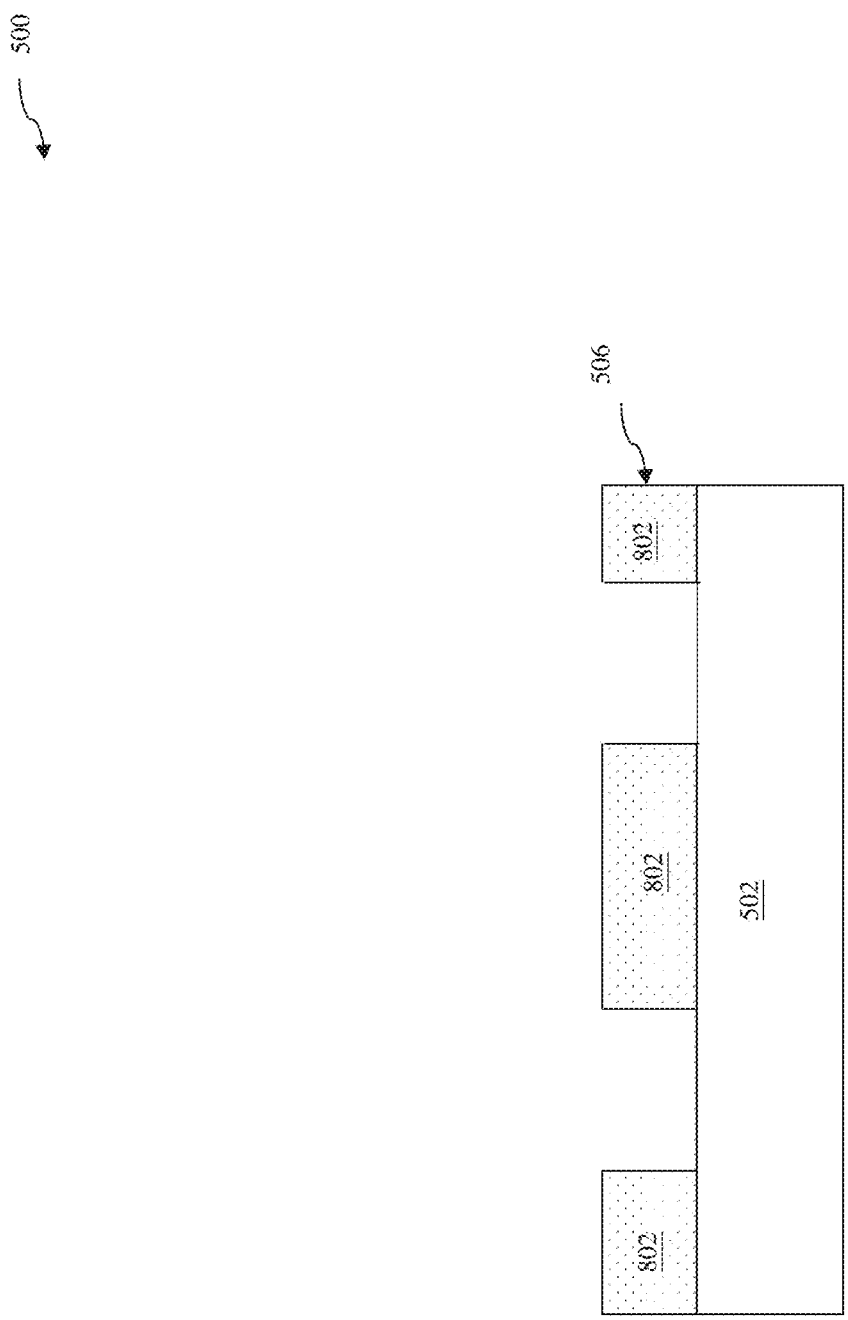

Referring now to FIGS. 1 and 8, the method 100 then proceeds to block 110, where the masking element is used to form a semiconductor device feature. In an embodiment, the masking element includes one or more of layers (e.g., the photoresist layer, the middle layer, and/or the underlayer) of the patterning layer 506. In a further embodiment, a photoresist layer of the patterning layer 506 is stripped after transferring the pattern to a middle layer (by suitable etching process discussed above) of the patterning layer 506. The patterned middle layer may then be used as the masking element to pattern additional layer(s). Referring to the example of FIG. 8, features 802 are formed of the target layer 504 of the substrate 502. The features 802 are defined by the masking element 702. Features 802 may be gate structures, fin structures such as provided in a fin-type field effect transistor, interconnect structures, isolation features, conductive features such as lines, and/or other suitable semiconductor device features.

The method 100 may continue with further steps not specifically described herein but understood by one of ordinary skill in the art. For example, the semiconductor device 500 may next be subjected to a rinsing process, such as a de-ionized (DI) water rinse. The rinsing process may remove residue particles.

Referring now to FIGS. 2, 9, 10A, 10B, 10C, 10D, 10E, 11A, 11B, 11C, and 11D, illustrated is an exemplary embodiment of a method 200 of forming a patterning layer including a sensitizer additive component at block 104 of the method 100. In some embodiments, the patterning layer may be a tri-layer patterning layer including an underlayer, a middle layer disposed over the underlayer, and a photoresist layer disposed over the middle layer. In some embodiments, one or more of the underlayer, middle layer, and photoresist layer may include sensitizer additive components, which may improve the sensitivity of the patterning layer.

Figure 2:
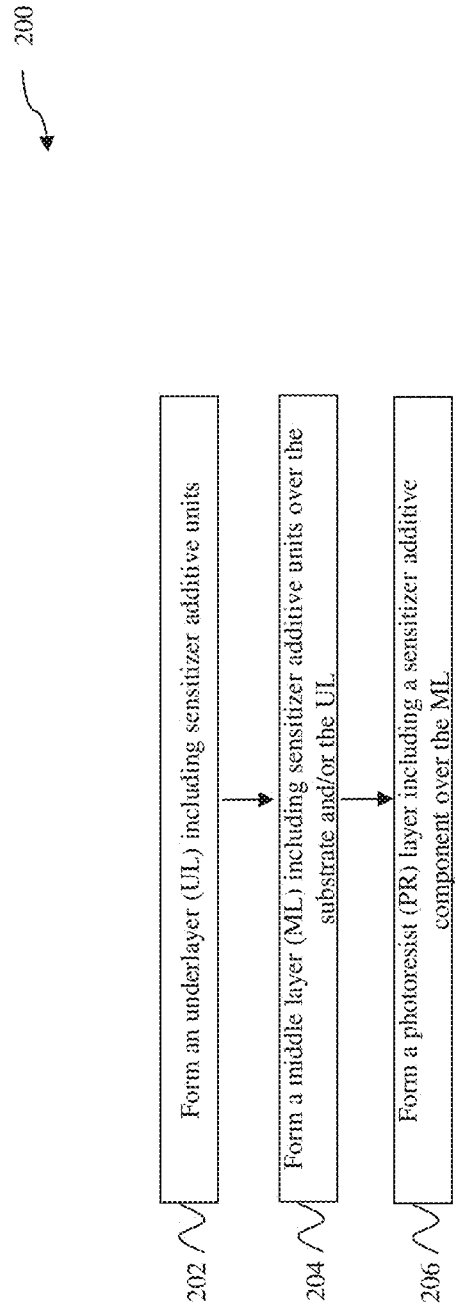
FIG. 2 is a flowchart of an embodiment of a method for forming a patterning layer according to various aspects of the present disclosure.
Figure 9:
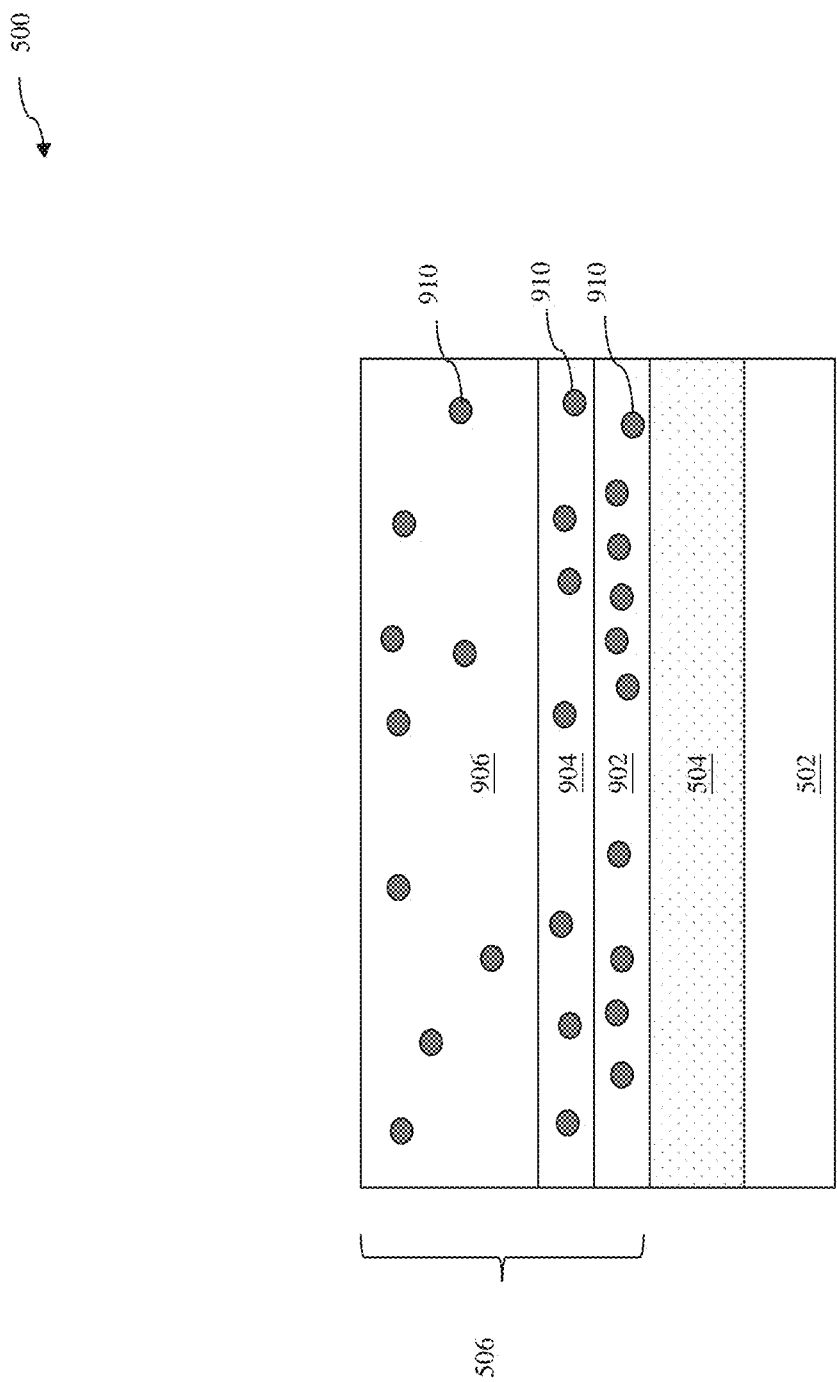

Referring to FIG. 2 and the example of FIG. 9, the method 200 begins at block 202, where an underlayer 902 of the patterning layer 506 is formed on the substrate 502. The underlayer may be a first (e.g., nearest the substrate) layer of the tri-layer patterning layer 506 and include a sensitizer additive component 910. In an embodiment, an underlayer material of the underlayer 902 includes an organic material. In a further embodiment, the organic material includes a plurality of monomers or polymers that are not cross-linked. In some embodiments, the underlayer material may contain a material that is patternable and/or have a composition tuned to provide anti-reflection properties. In some embodiments, the underlayer material includes a solvent. For example, the solvent may include an organic solvent including dimethyl sulfoxide (DMSO), tetrahydrofuran (THF), propylene glycol methyl ether (PGME), propylene glycol methyl ether acetate (PGMEA), n-Butyl acetate, Cyclohexanol, y-Butyrolactone (GBL), ethanol, propanol, butynol, methanol, ethylene, glycol, gamabutylactone, N-Methyl-2-pyrrolidone (NMP), alkylsulfoxide, carboxylic ester, carboxylic acid, alcohol, glycol, aldehyde, ketone, acid anhydride, lactone, halogenated alkane, non-halogenated alkane, branched alkane, non-branched alkane, cyclic alkane, non-cyclic alkane, saturated alkane, non-saturated alkane, or a combination thereof.

In some embodiments, the sensitizer additive component 910 includes a metal that absorbs the radiation (e.g., the EUV light) in a EUV exposure to generate secondary electrons. In some embodiments, the metal may have an absorption coefficient of the EUV light greater than an absorption coefficient for the main elements (e.g., carbon, oxygen, and hydrogen) of the polymer and the acid generator in the underlayer and/or other layers of the patterning layer 506. For example, the metal may include one of Te, Pb, Sn, Ag, Bi, Sb, Cs, Ba, La, Ce, and In. For further example, the metal may be a metal cation including one of $Cs^{n1+}$, $Ba^{n2+}$, $La^{n3+}$, $Ce^{n4+}$, where n1 is equal to or greater than 1, and each of the n2, n3, and n4 may be equal to or greater than 2. In some examples, the metal may be a metal cation including one of $In^{n+}$ and $Ag^{n+}$, where n is an integer equal to or greater than 1. In some examples, the metal may be a metal cation including $Sn^{n2+}$, $Sn^{n4+}$, or a Sn cation having a charge magnitude that is greater than 4.

In some embodiments, the sensitizer additive component 910 may include one or more anions, and bonds (e.g., ionic bond) are formed between the metal cation and each of the one or more anions. In some embodiments, each of the bonds may have a bonding energy large enough so that the bonds of the sensitizer additive component 910 are stable and do not break during a subsequent exposure process, and the sensitizer additive component 910 remains substantially the same during the exposure process. In some examples, the anions include one or more of $SO_3$—, N—, COO—, $CO_3$—. In some examples, the bonding energy of each of the bonds may be equal to or greater than about 100 kcal/mol. In some examples, the bonding energy of each of the bonds may be equal to or greater than about 150 kcal/mol.

Figure 10F:
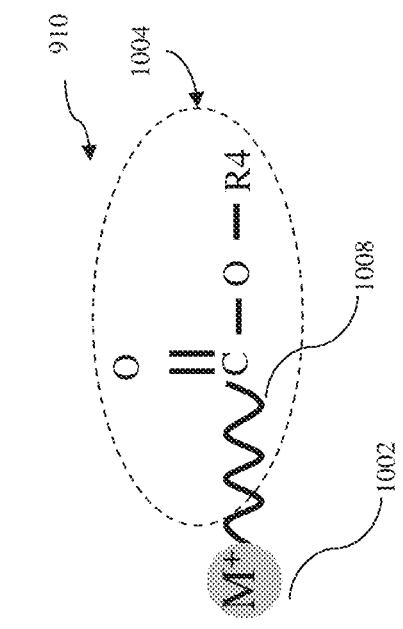

Referring now to the examples of FIGS. 10A, 10B, 10C, 10D, 10E, 10F, 10G, 10H, and 10I, in some embodiments, the sensitizer additive component 910 is an isolated molecule that is not attached to a polymer chain. In some embodiments, the total molecular weight of the sensitizer additive component 910 may be equal to or less than 1000. Referring to the example of FIG. 10A, a sensitizer additive component 910 may include a metal cation 1002 bonded to one or more anions 1004 by bonds 1006. In the example of FIG. 10A, each anion 1004 is a protecting group which may protect the metal cation 1002 from undesired reactions.

In some embodiments, the sensitizer additive component 910 is soluble in a particular solvent (e.g., the solvent of the underlayer 902 and/or other layers of the patterning layer 506). In some embodiments, as the solubility of the sensitizer additive component 910 is a function of the anion 1004, the solubility of the sensitizer additive component 910 may be optimized by determining the anion 1004 based on the anion 1004's solubility in the solvent. In some examples, the anion 1004 may have a carbon number that is equal to or greater than four to achieve the desired solubility in the solvent. In some embodiments, the sensitizer additive component 910 is a single organometallic sensitizer.

In some embodiments, the bond 1006 between the metal cation 1002 and the anion 1004 of the sensitizer additive component 910 remains substantially the same during the exposure process. For example, the bond 1006 between the metal cation 1002 and the anion 1004 has a bonding energy large enough so that the bond 1006 may remain stable and do not break during the exposure process. In some examples, the bonding energy may be equal to or greater than about 100 kcal/mol. In some embodiments, the total molecular weight of the sensitizer additive component 910 may be equal to or less than 1000.

Referring now to FIGS. 10B, 10C, 10D, and 10E, in some embodiments, the protecting groups 1004 remain substantially the same during the exposure process. The plurality of chemical formulas below (also shown in FIGS. 10B, 10C, 10D, and 10E) represent some exemplary embodiments of the sensitizer additive component 910, where the sensitizer additive component 910 is an isolated molecule not attached to a polymer chain, and the protecting groups 1004 of the sensitizer additive component 910 remain substantially the same during the exposure process.

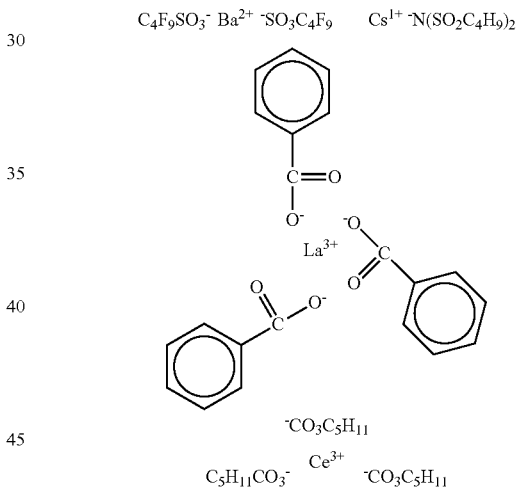

Referring now to the examples of FIGS. 10F, 10G, 10H, and 10I, in some embodiments, the protecting groups 1004 of the sensitizer additive component 910 have a polarity switch function, and may be referred to as the polarity switch protecting groups 1004 below. In some examples, the sensitizer additive component 910 including the polarity switch protecting groups 1004 may exhibit hydrophobic properties prior to exposure. Referring to the example of FIG. 10F, in some embodiments, the polarity switch protecting groups 1004 includes a carbon chain 1008 (also referred to as a spacer 1008) attaching the metal cation 1002 to a R3 unit and a R4 unit. In some examples, the number of carbons in the carbon chain 1008 may be between 1 and 10. In some examples, the number of carbons in the carbon chain 1008 may be greater than 10. In some examples, the carbon chain 1008 may include —CH2CH2CH2—, —CH2CH2COCH2—, —CH2CH2CH2CH2CH2—, —CH2COCH2—, and/or other suitable components. In some embodiments, the R3 unit may include one or more of —S—, —P—, —P(O$_2$)—, —C(=O)S—, —C(=O)O—, —O—, —N—, —C(=O)N—, —SO$_2$O—, —SO$_2$O—, —SO$_2$S—, —SO—, —SO$_2$—, and/or other suitable components. In some embodiments, the R4 unit may include a tertiary carbon. For example, the R4 unit may include one or more acid labile groups (ALGs). The chemical formulas below represent some exemplary embodiments of the R4 unit.

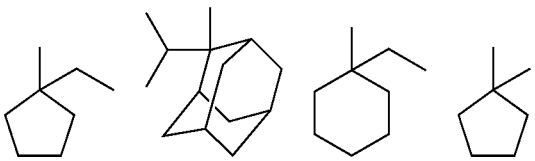

Figure 10G:
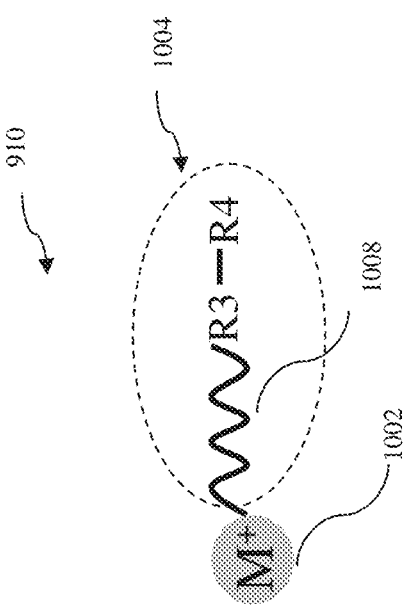
Figure 10I:
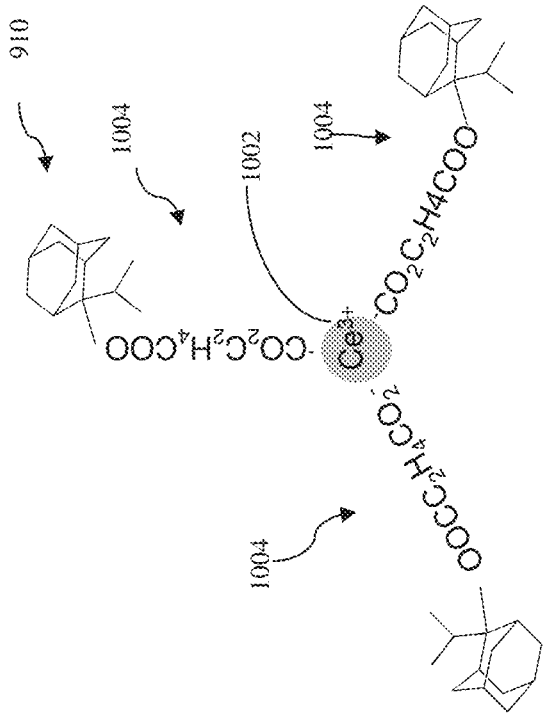
Figure 10H:
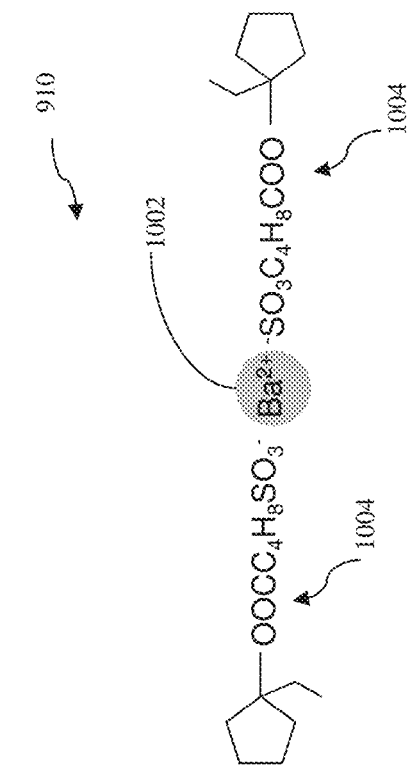

Referring now to FIG. 10G, illustrated is an example of the sensitizer additive component 910 where the R3 unit is —C(=O)O—. The plurality of chemical formulas below (also shown in FIGS. 10H and 10I) represent some exemplary embodiments of the sensitizer additive component 910 including polarity switch protecting groups 1004.

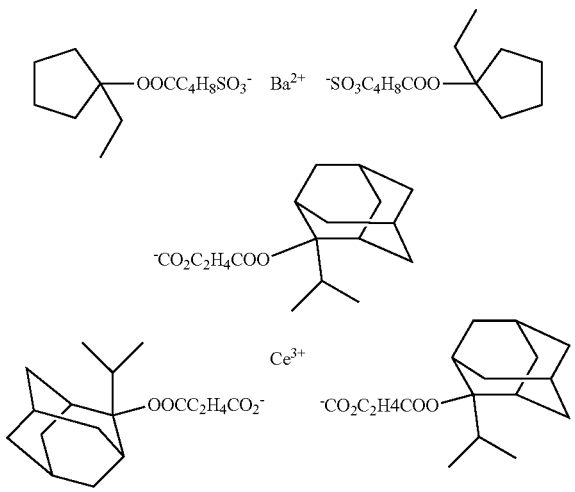

Figure 10K:
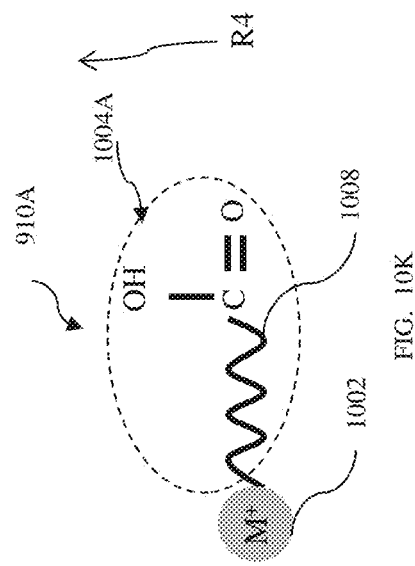
Figure 10J:
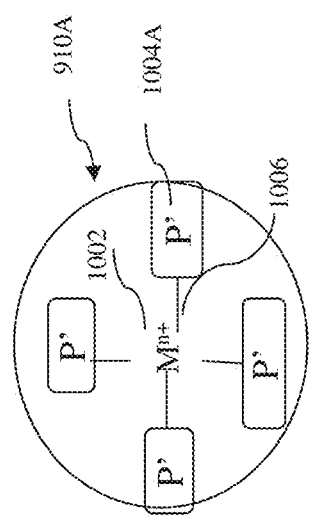

Referring now to the examples of FIGS. 10J and 10K, in some embodiments, during or after exposure to radiation, the R3 unit of the polarity switch protecting group 1004 may react with H$^+$ (e.g., provided by PAG and/or TAG), and the R4 unit may leave the sensitizer additive component 910. The resulting sensitizer additive component is referred to as the sensitizer additive component 910A. In some embodiments, the sensitizer additive component 910A may exhibit hydrophobic properties. As such, the reaction between the R3 unit and the $^{H+}$ and the leaving of the R4 unit may make the material including the sensitizer additive component 910A more hydrophilic in the regions exposed to radiation (e.g., regions of 506A of FIG. 6) than those regions of non-exposure. In some embodiments, the sensitizer additive component 910 in those regions of non-exposure remains substantially the same during the exposure process. Referring now to the example of FIG. 10J, illustrated is an example of the sensitizer additive components 910A including the polarity switch protecting groups 1004A bonded to the metal cation 1002 using the bond 1006. Referring now to the example of FIG. 10K, illustrated is an example of the resulting sensitizer additive component 910A after the sensitizer additive components 910 of FIG. 10G is exposed to radiation, where the R3 unit including —C(=O)O— has reacted with $^{H+}$ to form —C(=O)OH. As such, in some embodiments, the hydrophilic nature of the exposed regions (e.g., regions of 506A of FIG. 6) including the sensitizer additive component 910A is increased, which may contrast between exposed and non-exposed regions and allow for optical contrast improvement. In some embodiments, the sensitizer additive component 910A may help increase the exposed regions' dissolution rate in a developer used in the developing process.

Referring now to the examples of FIGS. 11A, 11B, 11C, and 11D, in some embodiments, the sensitizer additive component 910 may be bonded to a polymer chain. Illustrated in FIG. 11A is an exemplary copolymer 1100 including a polymer chain 1102 and a sensitizer additive component 910 attached to the polymer chain 1102. The polymer chain 1102 may be PHS (such as PHS polymers by DuPont™), acrylate, a 1-10 carbon unit, and/or other suitable polymer chain.

In the example of FIG. 11A, a metal cation 1002 of the sensitizer additive component 910 may be bonded to an anion 1104 using a bond 1108 where the anion 1104 is an R1 unit (also referred to as a polymer chain bonding component) attaching to the polymer chain 1102. The R1 unit may be unbranched or branched, cyclic or noncyclic, and may include saturated 1~9 carbon unit with hydrogen or halogen (e.g., alkyl, alkene), —S—, —P—, —P(O$_2$)—, —C(=O)S—, —C(=O)O—, —O—, —N—, —C(=O)N—, —SO$_2$O—, —SO$_2$O—, —SO$_2$S—, —SO—, —SO$_2$—, carboxylic acid, ether, ketone, ester unit and/or other suitable components. In some embodiments, the bonding energy of the bond 1108 is sufficiently large so that the bond 1108 is stable and does not break during the exposure process. For example, the bonding energy of the bond 1108 is equal to or greater than about 100 kcal/mol. Referring to the example of FIGS. 11A, 11B, and 11C, in some embodiments, the metal cation 1002 of the sensitizer additive component 910 may be bonded to one or more protecting groups 1004 using bonds 1006. In some examples, the bond energy of the bond 1006 may be equal to or greater than about 100 kcal/mol so that the bond 1006 is stable and does not break during the subsequent exposure process. Referring to the example of FIG. 11D, in some embodiments, the metal cation 1002 is not bonded to any protecting groups.

The plurality of chemical formulas below (also shown in FIGS. 11B, 11C, 11D) represent some exemplary embodiments of the copolymer 1100:

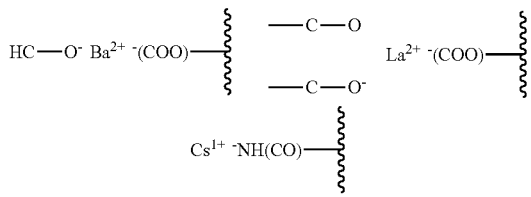

In some embodiments, the underlayer 902 may be formed by depositing a mixed material formed by mixing the underlayer material and a sensitizer additive material including the sensitizer additive component 910. In some embodiments, the mixed material is formed as a blending polymer (or polymer blend). The polymer blend may be a heterogeneous or homogeneous blend. In some embodiments, the mixed material is formed by copolymerization of the components. In other words, the sensitizer additive component is a copolymer of the underlayer material.

In an embodiment, the percentage by weight of the sensitizer additive components to a base polymer of the underlayer material is in a range from about 0.1% to about 10%. In an embodiment, the percentage is about 5%. In an embodiment, the percentage of the sensitizer additive components to the base polymer is the percentage at deposition. The percentage of the sensitizer additive components may provide control of acid generation and the transmittance of the patterning layer 506.

In some embodiments, the underlayer 902 may be formed by a spin-on coating process, chemical vapor deposition process (CVD), physical vapor deposition (PVD) process, and/or other suitable deposition processes. In an embodiment, the underlayer is omitted. In an embodiment, the underlayer does not include the sensitizer additive component 910.

The method 200 then proceeds to block 204, where a middle layer of the patterning layer 506 is formed over the substrate and/or the underlayer. The middle layer may be a second layer of a tri-layer patterning layer. In some embodiments, the middle layer may have a composition that provides an anti-reflective properties and/or hard mask properties for the lithography process. In an embodiment, the middle layer includes a silicon containing layer (e.g., a silicon hard mask material). The middle layer may include a silicon-containing inorganic polymer. In a further embodiment, the middle layer includes a siloxane polymer (e.g., a polymer having a backbone of O—Si—O—Si— etc.). The silicon ratio of the middle layer material may be controlled such as to control the etch rate. In other embodiments the middle layer may include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

Referring now to the example of FIG. 9, a middle layer 904 is disposed on the underlayer 902 as one component of the tri-layer patterning layer 506. The middle layer 904 may include a suitable material such as a hard mask material.

In some embodiments, the middle layer 904 may be formed by depositing a material including a mixture of the middle layer material and a sensitizer additive material including the sensitizer additive component 910. The mixture including the sensitizer additive component 910 may be formed substantially similar to the mixture of the sensitizer additive material and the underlayer material discussed above with reference the underlayer 902 of FIG. 9.

In some embodiments, the sensitizer additive material and a middle layer material are mixed prior to depositing on a substrate. In an embodiment, the percentage by weight of the sensitizer additive component to a base polymer of the middle layer material is in a range from about 0.1% to about 10%. In an embodiment, the percentage is about 5%. In an embodiment, the percentage of the sensitizer additive component to the base polymer is the percentage at deposition. The percentage of the sensitizer additive component may provide control of acid generation and the transmittance of the patterning layer 506. In some embodiments, the middle layer 904 may be formed by a spin-on coating process, chemical vapor deposition process (CVD), physical vapor deposition (PVD) process, and/or other suitable deposition processes. In an embodiment, the middle layer is omitted. In an embodiment, the middle layer does not include the sensitizer additive component 910.

The method 200 then proceeds to block 206 where a photoresist layer is formed over the middle layer. The photoresist layer may be a third, and top, layer of a tri-layer patterning layer. The photoresist layer may be a photosensitive layer operable to be patterned by a radiation as known in the art. The photoresist layer may include a photoresist (e.g., a chemical amplified (CA) resist), which is a radiation (e.g., light) sensitive material and may be a positive tone resist (PTD) or negative tone resist (NTD). A positive tone resist (or simply positive resist) is a type of photoresist in which the portion of the photoresist that is exposed to light becomes soluble to the photoresist developer. The portion of the photoresist that is unexposed remains insoluble to the photoresist developer. A negative tone resist (or simply negative resist) is a type of photoresist in which the portion of the photoresist that is exposed to light becomes insoluble to the photoresist developer. The unexposed portion of the photoresist is dissolved by the photoresist developer.

Specifically, the resist may include an organic polymer (e.g., positive tone or negative tone photoresist polymer), an organic-based solvent, and/or other suitable components known in the art. Other components may include a photo-acid generator (PAG) component, a thermal acid generator (TAG) component, a quencher component, a photo-decomposable base (PDB) component, and/or other suitable photosensitive component depending on the resist type. In some embodiments, when absorbing photo energy from an exposure process, the PAG forms a small amount of acid. The resist may include a polymer material that varies its solubility to a developer when the polymer is reacted with this generated acid. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs now known or later developed.

Exemplary organic based solvents include but are not limited to PGMEA (propylene glycol monomethyl ether acetate) (2-methoxy-1-methylethylacetate), PGME (propylene glycol monomethyl ether), GBL (gamma-butyrolactone), cyclohexanone, n-butyl acetate, and 2-heptanone. The organic polymer resin of the photosensitive material may include those resists formulated for KrF, ArF, immersion ArF, EUV, and/or e-beam lithography processes. Examples include Novolak (a phenol formaldehyde resin), PHS (poly(4-hydroxystyrene) derivatives), poly aliphatic resist, phenolic derivative, and/or other suitable formulations. In some embodiments, the organic polymer resion may include a cleavable group (ALG) and a non-cleavage group (e.g., a lactone unit, a polar unit).

In some embodiments, the photoresist layer 906 may include sensitizer additive component 910, which may be substantially similar to the sensitizer additive component 910 of the underlayer 902 discussed above. In some embodiments, the photoresist layer 906 may be formed by depositing a material including a mixture of the photoresist layer material and a sensitizer additive material including the sensitizer additive component 910. The mixture of the photoresist layer material and the sensitizer additive material may be formed substantially similar to the mixture of the sensitizer additive material and the underlayer material discussed above with reference the underlayer 902 of FIG. 9.

In an embodiment, the percentage by weight of the sensitizer additive component to a base polymer of the photoresist material is in a range from about 0.1% to about 10%. In an embodiment, the percentage of the sensitizer additive component to the base polymer is the percentage at deposition. The percentage of the sensitizer additive component may provide control of acid generation and the transmittance of the patterning layer 506. For example, excessive sensitizer additive component 910 may lower the transmittance of the photoresist layer 906, thereby affecting its performance. In an embodiment, the percentage by weight of the sensitizer additive component to a base polymer of the photoresist material may be in a range from about 0.1% to about 3%.

In some embodiments, the concentration of the sensitizer additive component 910 in the photoresist layer 906 may have substantially greater effect on the transmittance of the photoresist layer 906 than the concentration of the sensitizer additive component 910 in other layers (e.g., the underlayer 902, the middle layer 904) of the patterning layer 506. As such, in some embodiments, the sensitizer additive amount in the photoresist layer 906 is lower than the sensitizer additive component amount in the other layers. In some examples, the percentage by weight of the sensitizer additive component 910 in the photoresist layer 906 is less than the percentage by weight of the sensitizer additive component 910 in the underlayer 902 or in the middle layer 904 (e.g., by at least about 50% by weight).

In some embodiments, the photoresist layer 906 may be formed by a spin-on coating process, chemical vapor deposition process (CVD), physical vapor deposition (PVD) process, and/or other suitable deposition processes. In an embodiment, the photoresist layer 906 does not include the sensitizer additive component 910.

While in the illustrated example of FIG. 9 each layer of the patterning layer 506 includes the sensitizer additive component 910, it is understood that in various embodiments, one or more layers of the patterning layer 506 may not include the sensitizer additive component 910. In some examples, the photoresist layer 906 does not include the sensitizer additive component 910, while one or both of the underlayer 902 and the middle layer 904 may include the sensitizer additive component 910. In some examples, the photoresist layer 906 may include the sensitizer additive component 910, while one or both of the underlayer 902 and the middle layer 904 do not include the sensitizer additive component 910. In various embodiments, the concentration of the sensitizer additive component 910 may be designed based on the various properties and concentrations of the TAG, PAG, and/or quencher in one or more of the layers of the patterning layer 506 to reach a balance performance between sensitivity and LWR. In various embodiments, the underlayer 902, the middle layer 904, and the photoresist layer 906 may have various sensitizer additive component concentration profiles. In some embodiments, the sensitizer additive component 910 may be substantially uniformly distributed in the underlayer 902, the middle layer 904, and/or the photoresist layer 906. In some embodiments, the underlayer 902, the middle layer 904, and the photoresist layer 906 may have different sensitizer additive component concentration profiles. In one example, the sensitizer additive component 910 is uniformly distributed in the underlayer 902 and/or the middle layer 904, while the photoresist layer 906 may have a non-uniform sensitizer additive material concentration profile (e.g., varied continuously or varied stepwise). In some examples, the concentration of the sensitizer additive component may increase with a gradient from a top surface of the photoresist layer 906 to a bottom surface of the photoresist layer 906.

Referring now to the examples of FIGS. 12A, 12B, 12C, and 12D, in some embodiments, one or more of the underlayer 902, the middle layer 904, and the photoresist layer 906 may include a floating additive material. In some embodiments, the floating additive material may include a floating unit. In some embodiments, after deposition, the sensitizer additive component 910 in the deposited layer may be volatile and diffuse out of the deposited layer. A floating additive layer formed by the floating additive material may act as a diffusion barrier layer so that the sensitizer additive component 910 remains in the deposited layer. For example, after deposition, the floating additive material may form an upper layer or region at the top of the deposited layer. In an embodiment, the properties of the floating additive material allow the layer or region provided to be disposed at and/or move such that a layer of the floating additive material is formed at the top of the deposited layer. In other words, the properties of the polymer of the floating additive material allow it to "float" to the top of the deposited layer. The floating may be provided by a floatable component or unit attached to a polymer chain of the floating additive material. In some embodiments, the floating additive material may also provide one of an acid generator component or a base generator component, for example, also attached to the polymer chain. The acid generator component or base generator component can generate an acid or a base after exposure to a radiation and/or thermal treatment. In one example, the acid generator component may generate acid by reacting with the secondary electrons generated by the sensitizer additive component 910 in various layers (e.g., one or more of the underlayer 902, the middle layer 904, the photoresist layer 906) of the patterning layer 506.

Referring now to FIGS. 12A, 12B, and 12C, illustrated is an exemplary patterning layer 506 including a floating additive material. Referring to the example of FIG. 12A, the underlayer 902 is formed by depositing a material including an underlayer material, a sensitizer additive material, and a floating additive material on the substrate. After the deposition, the floating additive material 1202 in the underlayer 902 may form a floating additive layer 1204 at the top of the underlayer 902, thereby preventing the volatile sensitizer additive component 910 from diffusing out of the underlayer 902. Referring to the example of FIG. 12B, a middle layer 904 is disposed over the underlayer 902 and the floating additive layer 1204. In the example illustrated in FIG. 12B, the floating additive layer 1204 may move to the top of the middle layer 904. Alternatively, in some embodiments, the floating additive layer 1204 may not move to the top of the middle layer 904 and remain disposed between the underlayer 902 and the middle layer 904. In an example, the floating additive layer 1204 disposed between the underlayer 902 and the middle layer 904 may act as a barrier layer so that the sensitizer additive component 910 remains in the underlayer 902, which may help control the concentrations of the sensitizer additive component 910 in the various layers of the patterning layer 506. Referring now to the example of FIG. 12C, a photoresist layer 906 is formed over the middle layer 904 and the floating additive layer 1204. In the example illustrated in FIG. 12C, after the photoresist layer 906 is deposited, the floating additive layer 1204 may move to the top of the photoresist layer 906. Alternatively, in some embodiments, the floating additive layer 1204 may not move to the top of the photoresist layer 906, and remain disposed between the middle layer 904 and the photoresist layer 906.

In various embodiments, one or more of the middle layer 904 and the photoresist layer 906 may include both the sensitizer additive component 910 and a floating additive material 1202. In some embodiments, after the middle layer 904 including a floating additive material 1202 is deposited, the floating additive material 1202 may form a floating additive layer 1204 at the top of the middle layer 904, thereby preventing the volatile sensitizer additive component 910 in the middle layer 904 from diffusing out of the middle layer 904. In some embodiments, after the photoresist layer 906 is deposited, the floating additive layer 1204 moves to the top of the photoresist layer 906. Alternatively, the floating additive layer 1204 may remain disposed between the middle layer 904 and the photoresist layer 906 and act as a barrier so that the sensitizer additive component 910 remains in the middle layer 904 and does not diffuse into the photoresist layer 906, which may help control the concentrations of the sensitizer 910 in the middle layer 904 and the overlying photoresist layer 906.

In some embodiments, after the photoresist layer 906 including a floating additive material 1202 is deposited, the floating additive material 1202 may form a floating additive layer 1204 at the top of the photoresist layer 906, thereby preventing the volatile sensitizer additive component 910 in the photoresist layer 906 from diffusing out of the photoresist layer 906.

The floating additive material is now described in further detail. The floating additive material may include a polymer having a floatable unit. In some embodiments, the floating additive material may include one of an acid or a base component. The floatable unit and acid/base component may be bonded together by a polymer backbone. Illustrated in FIG. 12D is an example of a floatable unit 1208 attached to the polymer 1206 illustrated as a floating additive material 1202. The polymer chain 1206 may be PHS (such as PHS polymers by DuPont™), acrylate, a 1-10 carbon unit, and/or other suitable polymer chain. A CxFy unit is bonded to the polymer chain 1206. The CxFy may provide the "floating" properties of the additive material. The CxFy component may be a chain or branched unit. The number of carbons (x) may be between one (1) and nine (9), including 1 and 9. The number of florines (y) may be greater than 0 (e.g., between one (1) and nine (9), including 1 and 9).

In some embodiments, a R2 component may connect the CxFy unit to the polymer chain 1206. In other embodiments, the R2 component is omitted and the CxFy unit is connected directly to the polymer chain 1206. The R2 unit may be unbranched or branched, cyclic or noncyclic, and may include saturated 1~9 carbon unit with hydrogen or halogen (e.g., alkyl, alkene), or —S—, —P—, —P(O$_2$)—, —C(=O)S—, —C(=O)O—, —O—, —N—, —C(=O)N—, —SO$_2$O—, —SO$_2$O—, —SO$_2$S—, —SO—, —SO$_2$—, carboxylic acid, ether, ketone, ester unit and/or other suitable components.

Exemplary floating unit 1202 components may include one of the following:

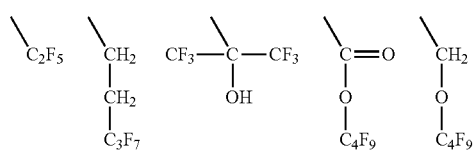

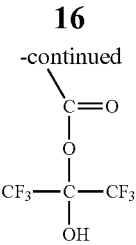

Figure 3:
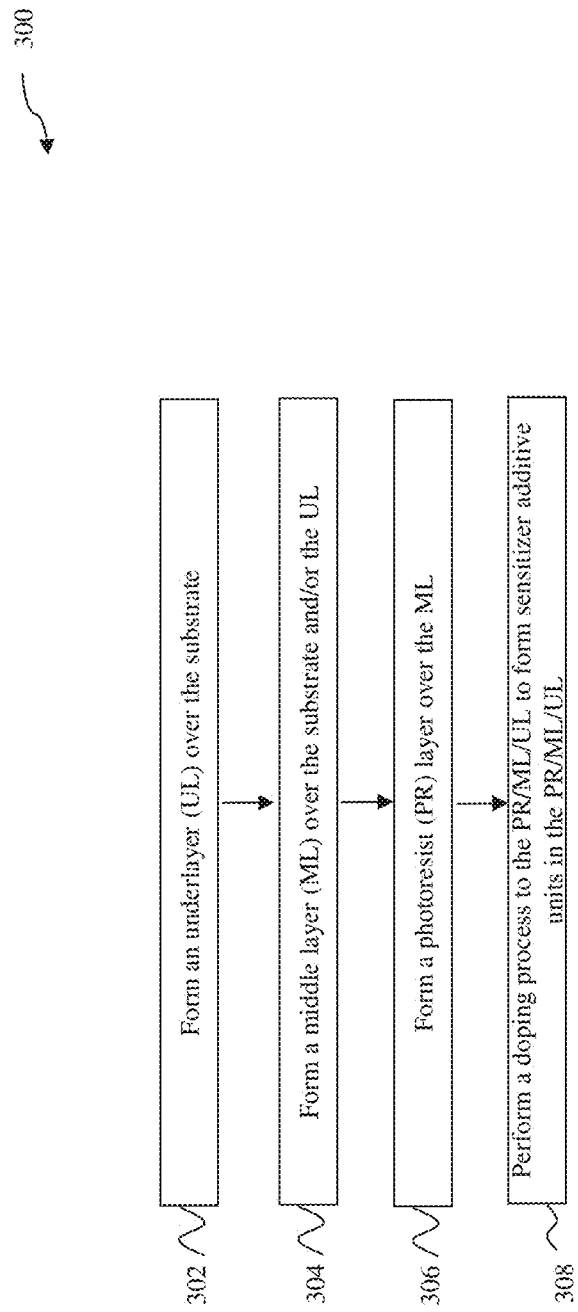
FIG. 3 is a flowchart of an embodiment of a method for forming a patterning layer according to various aspects of the present disclosure.
Figure 14:
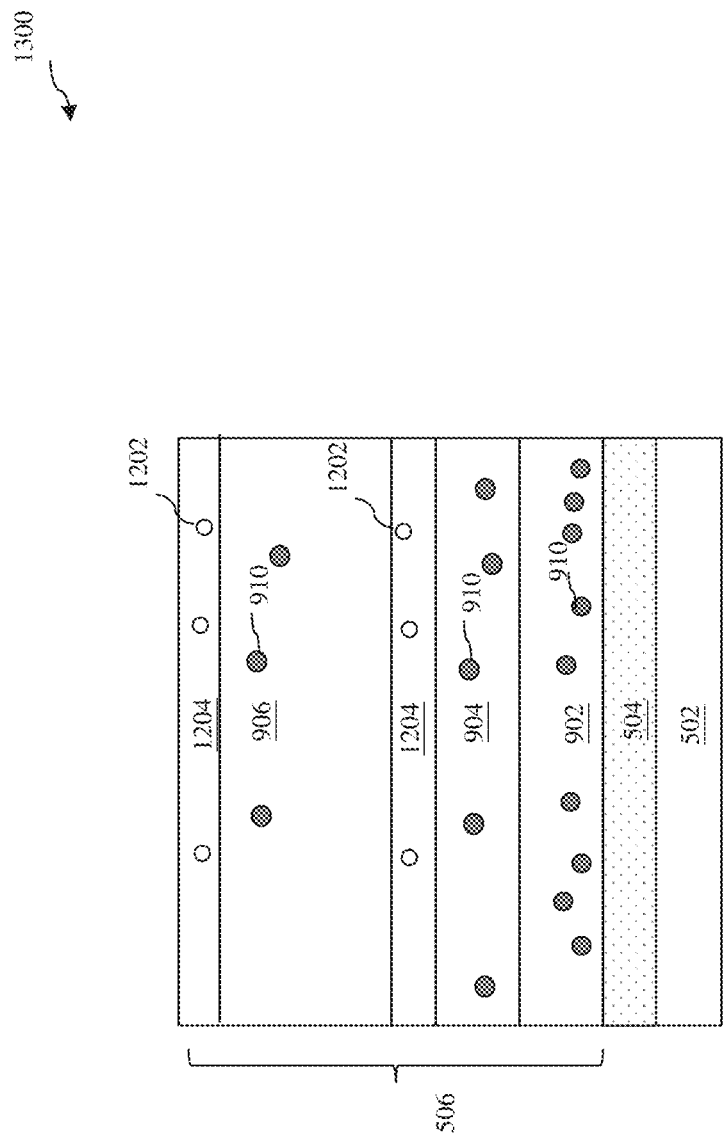

Referring now to FIGS. 3, 13, and 14, illustrated is another exemplary embodiment of a method 300 of forming a patterning layer including a sensitizer additive component at block 104 of the method 100. In such embodiments of the method 300, the sensitizer additive component in the patterning layer is formed using a doping process.

Referring to FIG. 3 and the example of FIG. 13, the method 300 starts at block 302, where an underlayer 902 is formed over the substrate 502. Block 302 may be substantially similar to block 202. In the example illustrated in FIG. 13, the underlayer 902 does not include the sensitizer additive component at this stage of the process. The method 300 proceeds to block 304, where a middle layer 904 is formed over the underlayer. Block 304 may be substantially similar to block 204. In the example illustrated in FIG. 13, the middle layer 904 does not include the sensitizer additive component at this stage of the process. The method 300 then proceeds to block 306, where a photoresist layer is formed over the middle layer 904. Block 306 may be substantially similar to block 306. In the example illustrated in FIG. 13, the middle layer 906 does not include the sensitizer additive component at this stage of the process.

In some embodiments, one or more of the underlayer 902, middle layer 904, and photoresist layer may include a floating additive material 1202, thereby forming one or more floating additive layers 1204. In the example of FIG. 13, a first floating additive layer 1204 is disposed over the photoresist layer 906, and a second floating additive layer 1204 is disposed between the middle layer 904 and the photoresist layer 906. However, it is understood that various configurations of the floating additive layers 1204 in the patterning layer 506 may be used to reduce the diffusion of the sensitizer additive and control the concentration and distribution of the sensitizer additive component in the various layers of the patterning layer 506. In some examples, a floating additive layers 1204 may be disposed between the underlayer 902 and the middle layer 904. In some examples, there is no floating additive layer 1204 disposed over the photoresist layer 906.

The method 300 then proceeds to block 308, where a doping process is performed to the patterning layer 506, so that the sensitizer additive component 910 is formed in one or more of the underlayer, the middle layer, and the photoresist layer. Referring now to FIG. 13, a doping process 1302 is performed to the patterning layer 506 of a device 1300. In some embodiments, the doping process 1302 includes an ion implantation process implanting ions into one or more of the underlayer, the middle layer, and the photoresist layer. In some embodiments, the dopant may include at least one of Te, Pb, Sn, Ag, Bi, Sb, Cs, Ba, La, Ce, and Ln. For further example, the dopant may include $Cs^{n1+}$, $Ba^{n2+}$, $La^{n3+}$, and/or $Ce^{n4+}$, where n1 is equal to or greater than 1, and each of n2, n3, and n4 is equal to or greater than 2. In some examples, the dopant may include a metal cation including one of $In^{n+}$ and $Ag^{n+}$, where n is an integer equal to or greater than 1. In some examples, the dopant may include $Sn^{2+}$, $Sn^{4+}$, and/or a Sn metal cation having an order higher than 4.

In some embodiments, the dopant may include one or more of the protective groups 1004. In some embodiments, the implanted ions may attach to each other or components in the underlayer, middle layer, or photoresist layer to form the sensitizer additive component 910. In some embodiments, the resulting sensitizer additive component 910 in one or more of the underlayer, the middle layer, and the photoresist layer may be substantially similar to the sensitizer additive component 910 discussed above with references to FIGS. 10A-11D.

In various embodiments, the sensitizer additive component concentration (e.g., by controlling dopant species, ion beam energy, implantation dose, implantation depth of the ion implantation process 1302) so as to result in desired concentration and concentration profile of the sensitizer additive component. In some embodiments, the ion implantation process includes multiple implantation steps to achieve the desired sensitizer additive component concentration.

Referring now to the example of FIG. 14, illustrated is the device 1300 after the doping process is performed. In some embodiments, the various layers of the patterning layer 506 may have different sensitizer additive component concentration. In some examples, the photoresist layer 906 may have a sensitizer additive component concentration less than the sensitizer additive component concentration in the underlayer 902 and/or the middle layer 904 (e.g., by at least 50% by weight). In some examples, the photoresist layer 906 has a concentration of the sensitizer additive component 910 of about 0.1% by weight or includes substantially no sensitizer additive component 910, while the middle layer 904 has a concentration of the sensitizer additive component 910 of about 5% by weight, and the underlayer 902 has a concentration of the sensitizer additive component 910 of about 10% by weight.

In some embodiments, the underlayer 902, the middle layer 904, and the photoresist layer 906 may have various sensitizer additive component concentration profiles. In some embodiments, the sensitizer additive component 910 may be substantially uniformly distributed in the underlayer 902, the middle layer 904, and/or the photoresist layer 906. In some embodiments, the underlayer 902, the middle layer 904, and the photoresist layer 906 may have different sensitizer additive component concentration profiles. In one example, the sensitizer additive component 910 is uniformly distributed in the underlayer 902 and/or the middle layer 904, while the photoresist layer 906 may have a non-uniform sensitizer additive material concentration profile (e.g., varied continuously or varied stepwise). For example, the concentration of the sensitizer additive component may increase with a gradient from a top surface of the photoresist layer 906 to a bottom surface of the photoresist layer 906. For further example, a top portion of the photoresist layer 906 may include about less than about 0.1% sensitizer additive component, while a bottom portion of the photoresist layer 906 may include about 1% sensitizer additive mate component. For further example, the non-uniform sensitizer additive component concentration profile of the photoresist layer 906 may be designed based on the transmittance profile of the photoresist layer 906 to achieve uniform acid generation.

It is noted that while in the example of FIG. 14 all layers of the patterning layer 506 include the sensitizer additive component 910 after the doping process is performed, it is understood that one or more of the underlayer 902, the middle layer 904, and the photoresist layer 906 of the patterning layer 506 may include substantially no sensitizer additive component 910 after the doping process is performed. In some examples, the photoresist layer 906 may include substantially no sensitizer additive component 910 after the doping process is performed.

Referring now to the example of FIGS. 4A, 4B, 4C, 4D, 15A, 15B, 15C, and 15D, illustrated are exemplary embodiments forming a patterning layer including a sensitizer additive component at block 104 of the method 100. In such embodiments, the patterning layer 506 may include one or more sensitizer additive layers 1402 disposed between the layers of tri-layer patterning layer 506 formed by deposition or coating. This is illustrated by the semiconductor device 15A, 15B, 15C, and 15D.

Figure 4A:
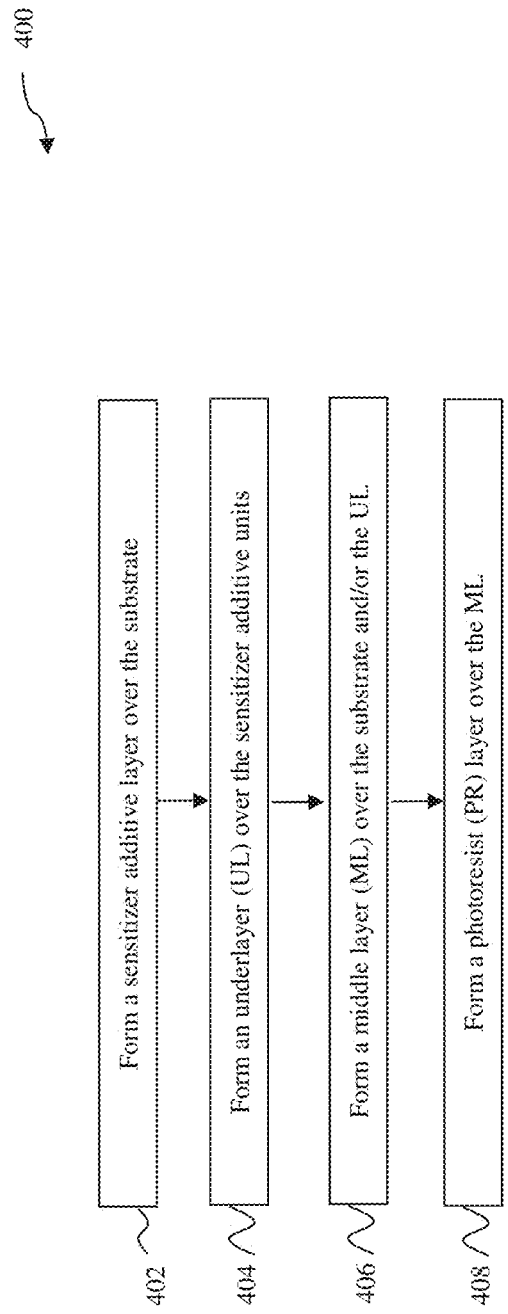
FIG. 4A is a flowchart of an embodiment of a method for forming a patterning layer according to various aspects of the present disclosure.

Referring now to FIGS. 4A and 15A, illustrated is an exemplary embodiment of a method 400 forming a patterning layer 506 including sensitizer additive component 910 at block 104 of the method 100. The method 400 starts at block 402, where a sensitizer additive layer 1402 is formed over the substrate 502. In some embodiments, the sensitizer additive layer 1402 may include a sensitizer additive layer material. In some embodiments, the sensitizer additive layer material may include an organic material. In a further embodiment, the organic material includes a plurality of monomers or polymers that are not cross-linked. In some embodiments, the sensitizer additive layer material includes a solvent. For example, the solvent may include an organic solvent may including dimethyl sulfoxide (DMSO), tetrahydrofuran (THF), propylene glycol methyl ether (PGME), propylene glycol methyl ether acetate (PGMEA), n-Butyl acetate, Cyclohexanol, γ-Butyrolactone (GBL), ethanol, propanol, butynol, methanol, ethylene, glycol, gamabutylactone, N-Methyl-2-pyrrolidone (NMP), alkylsulfoxide, carboxylic ester, carboxylic acid, alcohol, glycol, aldehyde, ketone, acid anhydride, lactone, halogenated alkane, non-halogenated alkane, branched alkane, non-branched alkane, cyclic alkane, non-cyclic alkane, saturated alkane, non-saturated alkane, or a combination thereof.

In some embodiments, the sensitizer additive layer 1402 may be formed by depositing a material including a mixture of a sensitizer additive layer material and a sensitizer additive material including the sensitizer additive component 910. The mixture of the sensitizer additive layer material and the sensitizer additive material may be substantially similar to the mixture of the sensitizer additive material and the underlayer material described above with reference to FIG. 9.

In some embodiments, the sensitizer additive layer 1402 may include a floating additive material 1202 substantially similar to the floating additive material 1202 described above with reference to FIGS. 12A, 12B, 12C, and 12D. After depositing, the floating additive material 1202 may move up to the top of the sensitive additive layer 1402 and form a floating additive layer 1204.

The sensitizer additive layer 1402 may be formed by a spin-on coating process, chemical vapor deposition process (CVD), physical vapor deposition (PVD) process, and/or other suitable deposition processes.

Referring now to FIGS. 4A and 15A, the method 400 then proceeds to block 404, where an underlayer 902 is formed over the sensitizer additive layer 1402. Block 404 may be substantially similar to block 202 of the method 200. The method 400 then proceeds to block 406, where a middle layer 904 is formed over the under layer 902. Block 406 may be substantially similar to block 204 of the method 200. The method 400 then proceeds to block 408, where a photoresist layer 906 is formed over the middle layer 904. Block 408 may be substantially similar to block 206 of the method 200.

Referring now to FIGS. 4B, 4C, 4D, 15B, 15C, and 15D, in various embodiments, the patterning layer 506 may include one or more sensitizer additive layers disposed between or over the underlayer 902, middle layer 904, and photoresist layer 906. The same description provided above with reference to FIGS. 4A and 15A regarding the underlayer 902, middle layer 904, and photoresist layer 906 and the sensitizer additive layer 1402 applies except with the differences noted below.

Figure 4B:
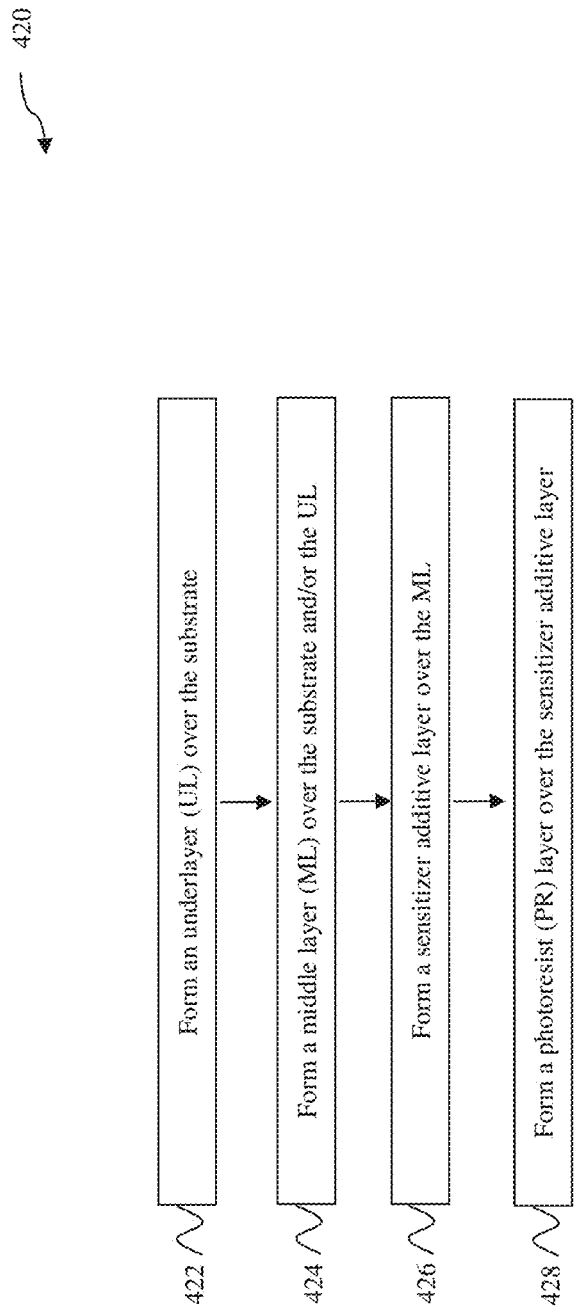
FIG. 4B is a flowchart of an embodiment of a method for forming a patterning layer according to various aspects of the present disclosure.

Referring now to FIGS. 4B and 15B, in an exemplary embodiment of a method 420, at block 422, an underlayer 902 is formed over the substrate. The method 420 proceeds to block 424, where a middle layer is formed over the underlayer. The method 420 then proceeds to block 426, where a sensitizer additive layer 1402 is formed between the middle layer 904 and photoresist layer 906. The method 420 proceeds to block 428, where a photoresist layer is formed over the sensitizer additive layer 1402.

Figure 4C:
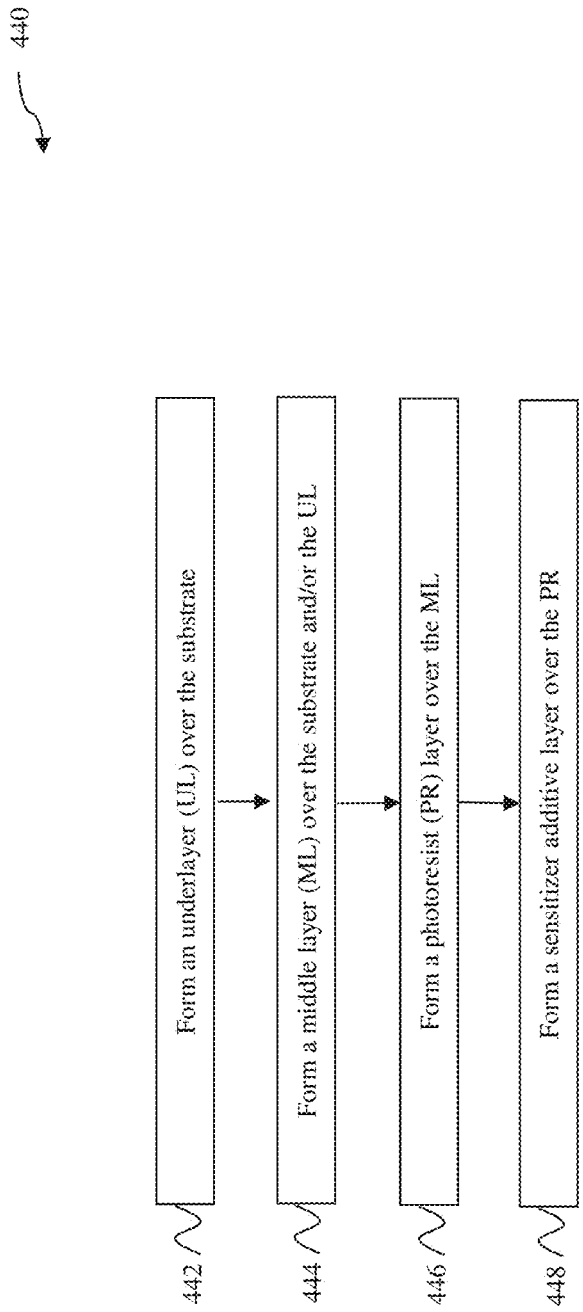
FIG. 4C is a flowchart of an embodiment of a method for forming a patterning layer according to various aspects of the present disclosure.

Referring now to FIGS. 4C and 15C, in an embodiment of a method 440, at block 442, an underlayer 902 is formed over the substrate. The method 440 proceeds to block 444, where a middle layer 904 is formed over the underlayer 902. The method 440 then proceeds to block 446, where a photoresist layer 906 is formed over the middle layer 904. The method 440 then proceeds to block 448, where a sensitizer additive layer 1402 is formed over the photoresist layer 906.

Figure 4D:
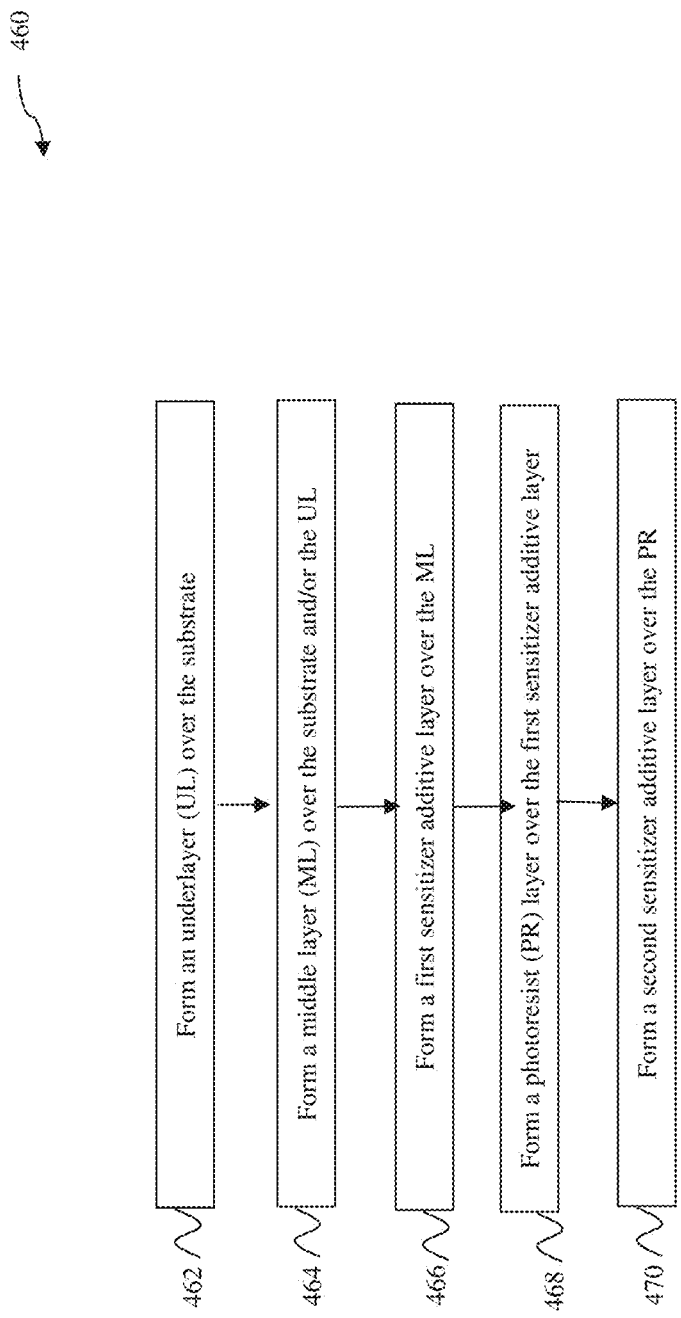
FIG. 4D is a flowchart of an embodiment of a method for making a semiconductor device according to various aspects of the present disclosure.

Referring now to FIGS. 4D and 15D, in an embodiment of a method 460, at block 462, an underlayer 902 is formed over the substrate. The method 460 proceeds to block 464, where a middle layer is formed over the underlayer. The method 460 then proceeds to block 466, where a first sensitizer additive layer 1402A is formed over the middle layer 904. The method 460 proceeds to block 468, where a photoresist layer is formed over the first sensitizer additive layer 1402A. The method 460 then proceeds to block 470, where a second sensitizer additive layer 1402B is formed over the photoresist layer 906. In some embodiments, the sensitizer additive component concentration in the second sensitizer additive layer 1402B may have a substantially greater effect on the transmittance of the photoresist layer 906 than the sensitizer additive component concentration in the first sensitizer additive layer 1402A. As such, in some examples, the first sensitizer additive layer 1402A may have a sensitizer additive component concentration higher than the sensitizer additive component concentration of the second sensitizer additive layer 1402B (e.g., by at least about 50% by weight)

In various embodiments, the sensitizer additive layers 1402, 1402A, and/or 1402B may have various sensitizer additive component concentration profiles. In some examples, the sensitizer additive component 910 is uniformly distributed in the sensitizer additive layers 1402, 1402A, and/or 1402B. In some examples, one or more of the sensitizer additive layers 1402, 1402A, and/or 1402B may have a non-uniform sensitizer additive material concentration profile (e.g., varied continuously or varied stepwise).

Figure 16:
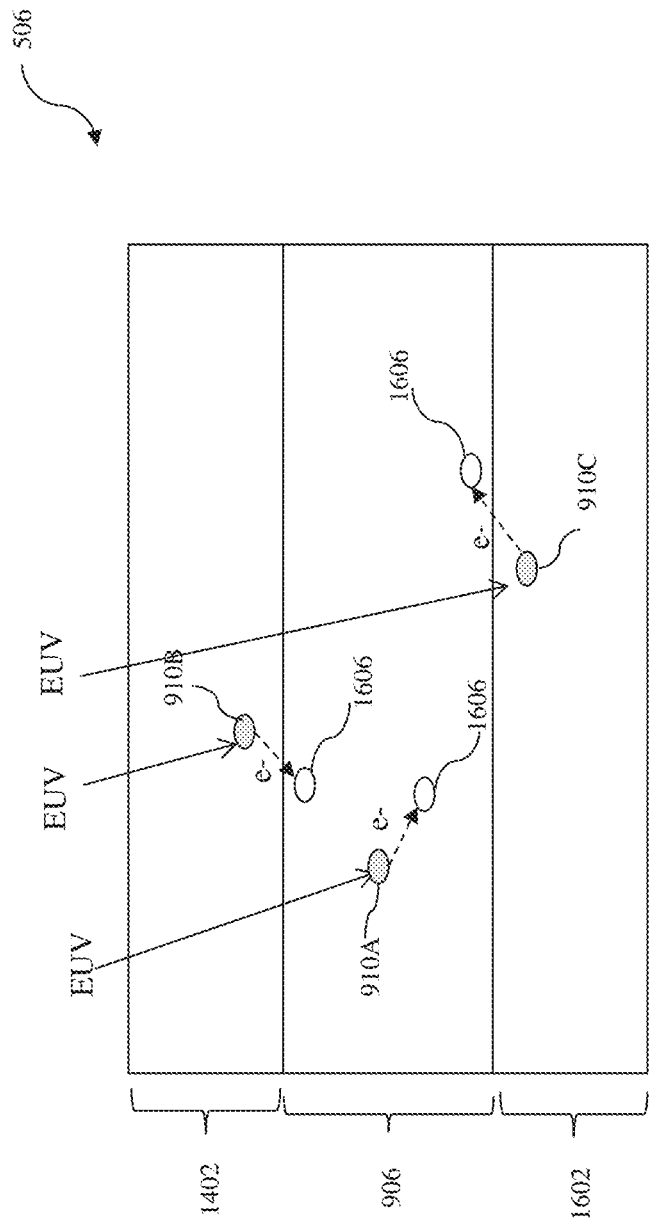

Referring now to the example of FIG. 16, photo-acid generation in the patterning layer 506 during an exposure process is illustrated. As illustrated in FIG. 16, a photoresist layer 906 is disposed over a layer 1602. The layer 1602 may be an underlayer 902, a middle layer 904, and/or a sensitizer additive layer 1402 disposed under the photoresist layer 906. A sensitizer additive layer 1402 is disposed over the photoresist layer 906. In some embodiments, during the exposure process at block 106, sensitizer additive components 910A, 910B, and 910C in various layers of the patterning layer 506 may absorb the EUV light and generate secondary electrons, which may be used by acid generators in the photoresist layer 906 to generate an acid. For example, each of sensitizer additive component 910A in the photoresist layer 906, sensitizer additive component 910B in the sensitizer additive layer 1402, and sensitizer additive component 910C in the layer 1602 may absorb a EUV light and generating a secondary electron. The secondary electron's energy may be used by acid generators 1606 (e.g., a TAG, a PAG) in the photoresist layer 906 to generate an acid.

Various advantages may be present in one or more embodiments of the methods, devices and compositions described herein. It is understood, however, that other embodiments may offer additional advantages, and not all advantages are necessarily disclosed herein, and that no particular advantage is required for all embodiments. One advantage is that the patterning layer offers improved lithography performance. By using a sensitizer additive component including an element that has an absorption coefficient of the EUV light greater than an absorption coefficient for the main elements (e.g., carbon, oxygen, and hydrogen) in the patterning layer, EUV light absorption is improved. Consequently, the acid generator is more efficient in generating the acid, which leads to better photoresist sensitivity. Another advantage is that one or both of a floating additive layer and a topcoat layer may be used to reduce the diffusion of the sensitizer additive component, thereby controlling the concentration of the sensitizer additive component in various layers of the patterning layer. Yet another advantage is that a doping process may be used to add the sensitizer additive component to the patterning layer, which may help achieve various sensitizer additive concentration profiles in the various layers of the patterning layer. Yet another advantage is that the sensitizer additive component may include a polarity switch protecting group and exhibit hydrophilic properties after exposure to radiation, thereby providing for increased hydrophilicity of exposed regions of the photoresist material.

Thus, in one embodiment described herein a method of making a semiconductor device is provided that includes providing a semiconductor substrate. A layer including an additive component is formed over the semiconductor substrate. The additive component includes a metal cation. One or more bonds bonding the metal cation and one or more anions are formed. Each of the one or more anions is one of a protecting group and a polymer chain bonding component. The polymer chain bonding component is bonded to a polymer chain of the layer. The semiconductor substrate is exposed to a radiation beam.

In an embodiment, a method is described which includes forming a photosensitive layer over a substrate. The photosensitive layer includes an additive component. The additive component includes a metal and at least one of a protecting group and a polymer chain bonding component. The polymer chain bonding component is bonded to a polymer chain of the photosensitive material. The metal is bonded to the at least one of the protecting group and the polymer chain bonding component using one or more bonds. The photosensitive layer is selectively exposed to a radiation beam. A developer is applied to the photosensitive layer, which removes regions of the photosensitive layer exposed to the radiation beam.

In an embodiment, a method of semiconductor device fabrication is described which includes forming a first additive layer on a target substrate. The first additive layer includes an additive component including a metal. A photoresist layer include an acid generator is formed adjacent to the first additive layer. The target substrate having the first additive layer and the photoresist layer disposed thereon is exposed using a radiation. The additive component of the first additive layer absorbs the radiation and generates a secondary electron. The acid generator of the photoresist layer generates an acid using energy of the secondary electron.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of semiconductor device fabrication, wherein the method comprises:
   forming a first additive layer on a target substrate, wherein the first additive layer includes a sensitizer additive component including a metal and a floating additive component;
   after the forming of the first additive layer, forming a photoresist layer including an acid generator to on the first additive layer;
   floating the floating additive component over the sensitizer additive component to form a floating additive layer; and
   exposing the target substrate having the first additive layer and the photoresist layer disposed thereon using a radiation,
   wherein upon the exposing of the target substrate, the sensitizer additive component of the first additive layer absorbs the radiation and generates a secondary electron,
   wherein the acid generator of the photoresist layer generates an acid using energy of the secondary electron,
   wherein the sensitizer additive component is an isolated molecule not attached to a polymer chain.

2. The method of claim 1, wherein the floating additive layer is at a top surface of the first additive layer, wherein the floating additive layer prevents the sensitizer additive component from diffusing out of the first additive layer.

3. The method of claim 1, further comprising:
   forming a second additive layer including the sensitizer additive component on the photoresist layer, wherein the exposing further includes exposing the target substrate having the second additive layer disposed thereon.

4. The method of claim 3,
   wherein the second additive layer has a concentration of the sensitizer additive component less than a concentration of the sensitizer additive component in the first additive layer.

5. A method of making a semiconductor device, the method comprising:
   providing a semiconductor substrate;
   forming a first layer including a floating additive component over the semiconductor substrate;
   forming a second layer including a polymer chain, a floating additive component, and a volatile additive component over the first layer, wherein the volatile additive component includes a metal cation, wherein the floating additive component in the second layer includes fluorocarbons, and wherein the forming the second layer further includes:
   forming one or more ionic bonds bonding the metal cation and one or more anions,
   wherein each of the one or more anions is one of a protecting group or a polymer chain bonding component, and
   wherein the polymer chain bonding component is bonded to the polymer chain of the second layer;
   floating the floating additive component of the first layer to a top region of the first layer to form a first floating additive layer;
   floating the floating additive component of the second layer to a top region of the second layer to form a second floating additive layer, wherein the second layer is disposed between the first and the second floating additive layers; and
   exposing the second layer to an ultraviolet (UV) radiation, deep ultraviolet (DUV) radiation, extreme ultraviolet (EUV) radiation, or X-ray radiation, wherein after the exposing of the second layer, the one or more ionic bonds remain stable and do not break.

6. The method of claim 5, wherein the one or more anions include one or more of SO3—, N—, COO—, CO3—.

7. The method of claim 5, wherein the metal cation is a cation of a metal selected from the group consisting of Cs, Ba, La, and Ce.

8. The method of claim 5, wherein the polymer chain bonding component includes at least one selected from the group consisting of a 1-9 carbon unit with hydrogen or halogen, —S—, —P—, —P(O2)—, C(=O)S—, —C(=O)O—, —O—, —N—, —C(=O)N—, —SO2O—, —SO2S—, —SO—, —SO2—, carboxylic acid, ether, ketone, and ester unit.

9. The method of claim 5, wherein the one or more ionic bonds further includes:
   a first ionic bond bonding the metal cation and the protecting group; and
   a second ionic bond between the metal cation and the polymer chain bonding component.

10. The method of claim 5, wherein the protecting group includes the following chemical formula:

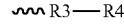

wherein ∿∿∿ includes a carbon chain including a carbon number between 1 and 10, wherein R3 includes at least one selected from the group consisting of —S—, —P—, —P(O2)—, —C(=O)S—, —C(=O)O—, —O—, —N—, —C(=O)N—, —SO2O—, —SO2S—, —SO—, and —SO2—, and wherein R4 includes a tertiary carbon.

11. The method of claim 10, further comprising:
during the exposing of the second layer, R4 of the protecting group leaves the protecting group.

12. The method of claim 5, wherein the forming the second layer including the volatile additive component includes performing a doping process to form the volatile additive component, wherein the floating additive components of the first and the second layers are formed before the forming of the volatile additive component.

13. A method, comprising:
   forming a floating additive component in a first layer over a substrate;

forming a photosensitive layer over the first layer, wherein the photosensitive layer comprises a polymer chain and a sensitizer additive component bonded to the polymer chain, wherein a concentration of the sensitizer additive component increases with a gradient from a top surface of the photosensitive layer to a bottom surface of the photosensitive layer, wherein the sensitizer additive component comprises:

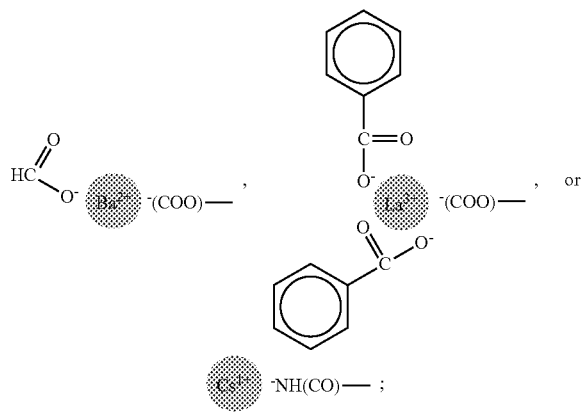

floating the floating additive component to a region adjacent a top surface of the photosensitive layer;
selectively exposing the photosensitive layer to a radiation beam; and
applying a developer to the photosensitive layer, wherein the developer removes regions of the photosensitive layer exposed to the radiation beam.

14. The method of claim 13, further comprising:
depositing a topcoat layer over the photosensitive layer.

15. The method of claim 13, wherein the forming the photosensitive layer includes:
performing a doping process to form the sensitizer additive component in the photosensitive layer.

16. The method of claim 5, wherein the one or more ionic bonds have a bonding energy equal to or greater than 100 kcal/mol.

17. The method of claim 13, wherein the photosensitive layer comprises:

a bottom organic layer having an organic solvent;
a middle anti-reflective coating layer over the bottom organic layer, the middle anti-reflective coating layer having a silicon-containing inorganic polymer; and
a top photoresist layer over the middle anti-reflective coating layer, the top photoresist layer having a photo-acid generator (PAG) component, a thermal acid generator (TAG) component, a quencher component, a photo-decomposable base (PDB) component, or other suitable photosensitive components.

18. The method of claim 17, wherein the top photoresist layer does not include the sensitizer additive component.

19. The method of claim 1, wherein the sensitizer additive component comprises:

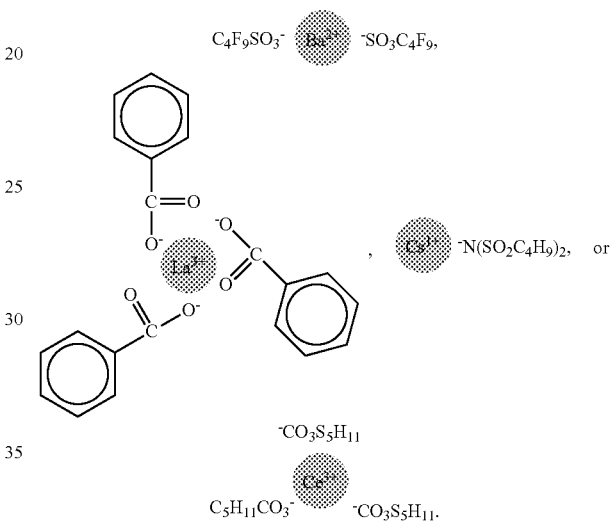

20. The method of claim 3, wherein the floating additive layer is at a top surface of the second additive layer, wherein the floating additive layer prevents the sensitizer additive component from diffusing out of the second additive layer.

* * * * *